(12) United States Patent
Ohtani et al.

(10) Patent No.: US 7,906,847 B2
(45) Date of Patent: Mar. 15, 2011

(54) SEMICONDUCTOR DEVICE

(75) Inventors: Hisashi Ohtani, Tochigi (JP); Eiji Sugiyama, Ichinomiya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 295 days.

(21) Appl. No.: 12/155,055

(22) Filed: May 29, 2008

(65) Prior Publication Data

US 2008/0303140 A1    Dec. 11, 2008

(30) Foreign Application Priority Data

Jun. 7, 2007   (JP) ................................. 2007-151168

(51) Int. Cl.
*H01L 23/29* (2006.01)
(52) U.S. Cl. . 257/729; 438/127; 438/155; 257/E23.121; 257/E23.119
(58) Field of Classification Search .................. 438/127, 438/155
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,118,502 A | 9/2000 | Yamazaki et al. | |
| 6,224,965 B1 | 5/2001 | Haas et al. | |
| 6,376,333 B1 | 4/2002 | Yamazaki et al. | |
| 6,403,221 B1 | 6/2002 | Nakamura et al. | |
| 6,762,508 B1 | 7/2004 | Kiso et al. | |
| 6,998,282 B1 | 2/2006 | Yamazaki et al. | |
| 7,049,178 B2 | 5/2006 | Kim et al. | |
| 7,050,138 B1 | 5/2006 | Yamazaki et al. | |
| 7,061,083 B1 | 6/2006 | Usami et al. | |
| 7,361,519 B2 | 4/2008 | Yamazaki et al. | |
| 7,485,489 B2 | 2/2009 | Björbell | |

(Continued)

FOREIGN PATENT DOCUMENTS

EP    0 938 441    9/1999

(Continued)

OTHER PUBLICATIONS

Nagura et al., Japanese Patent Publication JP07-007246.*

(Continued)

*Primary Examiner* — N Drew Richards
*Assistant Examiner* — Mamadou Diallo
(74) *Attorney, Agent, or Firm* — Eric J. Robinson; Robinson Intellectual Property Law Office, P.C.

(57) ABSTRACT

To provide a semiconductor device which can increase reliability with respect to external force, especially pressing force, while the circuit size or the capacity of memory is maintained. A pair of structure bodies each having a stack of fibrous bodies of an organic compound or an inorganic compound, which includes a plurality of layers, especially three or more layers, is impregnated with an organic resin, and an element layer provided between the pair of structure bodies are included. The element layer and the structure body can be fixed to each other by heating and pressure bonding. Further, a layer for fixing the element layer and the structure body may be provided. Alternatively, the structure body fixed to an element layer can be formed in such a way that after a plurality of fibrous bodies is stacked over the element layer, the fibrous bodies are impregnated with an organic resin.

32 Claims, 26 Drawing Sheets

U.S. PATENT DOCUMENTS

| | | |
|---|---|---|
| 2003/0032210 A1 | 2/2003 | Takayama et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2007/0004125 A1 | 1/2007 | Watanabe et al. |
| 2007/0044303 A1 | 3/2007 | Yamano |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0224941 A1 | 9/2008 | Sugiyama et al. |

FOREIGN PATENT DOCUMENTS

| | | |
|---|---|---|
| EP | 0 939 441 | 9/1999 |
| EP | 1092739 | 4/2001 |
| EP | 1589797 | 10/2005 |
| EP | 1 758 438 | 2/2007 |
| EP | 1 970 951 | 9/2008 |
| JP | 05-190582 | 7/1993 |
| JP | 08-250745 | 9/1996 |
| JP | 08-288522 | 11/1996 |
| JP | 10-092980 | 4/1998 |
| JP | 2003-174153 | 6/2003 |
| JP | 2004-362341 | 12/2004 |
| WO | WO 96/09158 | 3/1996 |
| WO | WO 01/01740 | 1/2001 |
| WO | WO 04/001848 | 12/2003 |

OTHER PUBLICATIONS

Search Report (Application No. 08009111.9) dated Oct. 17, 2008.

* cited by examiner 301
302
301

311
312
311

321
322
321

331
332
331

341
342
341

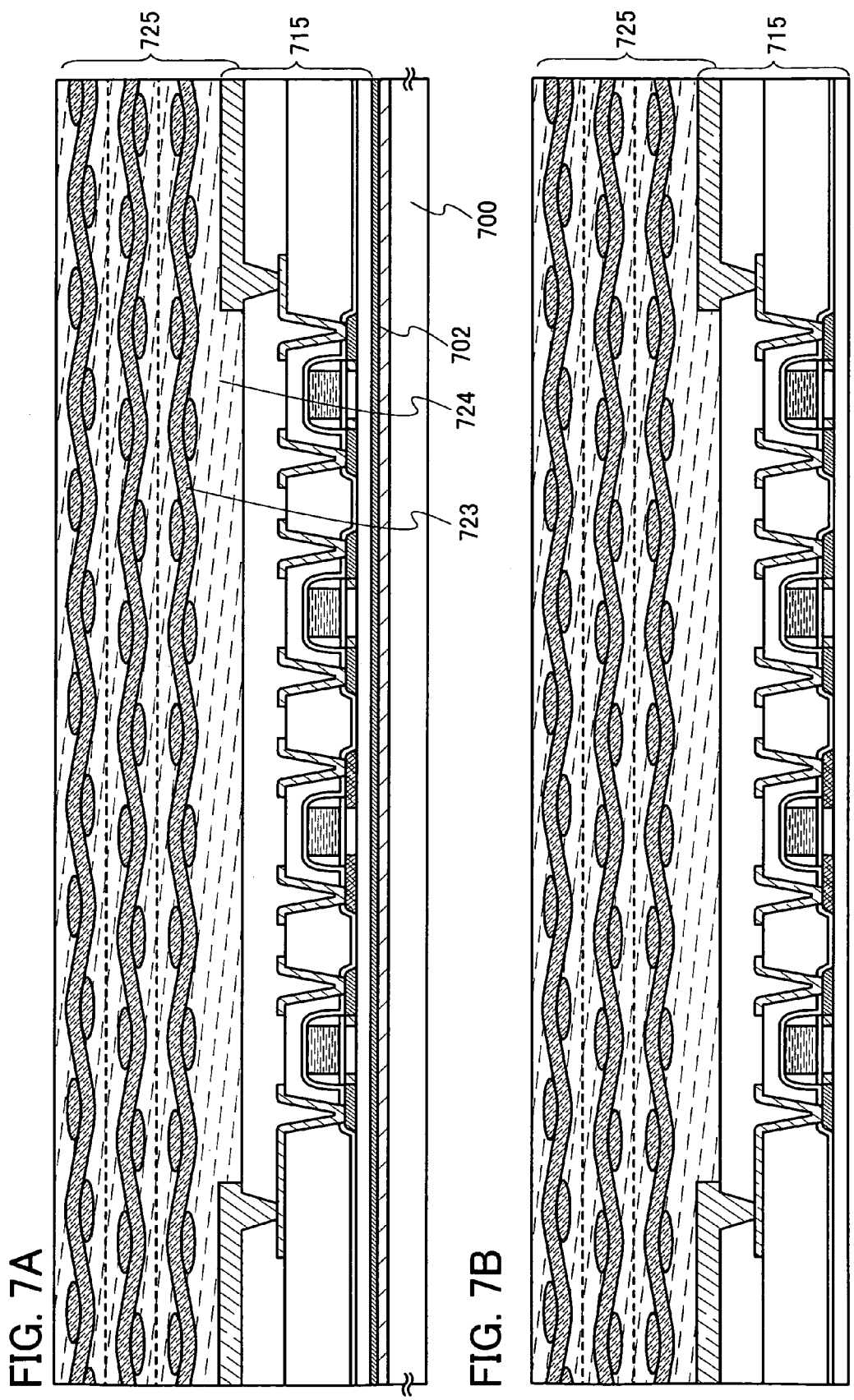

SEMICONDUCTOR DEVICE

BACKGROUND OF THE INVENTION

1. Field of the Invention

The present invention relates to semiconductor devices using substrates having flexibility.

2. Description of the Related Art

A substrate having flexibility has advantages in that mechanical strength with respect to vibration and shock is excellent as compared to a glass substrate, the thickness is easily suppressed, and a degree of freedom in shape is high. Therefore, a semiconductor device using the substrate having flexibility is expected to have various applications. The substrates having flexibility may include a substrate which does not have heat resistance high enough to withstand heat treatment in a manufacturing process of a semiconductor element. For this case, a manufacturing method is proposed in which after a semiconductor element is formed over a substrate having heat resistance which is separately prepared, the semiconductor element is separated from the substrate to be bonded to the substrate having flexibility.

The present applicant proposes techniques of separation and transfer, which are described in Reference 1 (Japanese Patent No. 3364081) and Reference 2 (Japanese Patent No. 3406727). In Reference 1, a technique is described in which separation is performed by removing a silicon oxide layer which serves as a separation layer by wet etching. In Reference 2, a technique is described in which separation is performed by removing a silicon layer which serves as a separation layer by dry etching. Further, the present applicant proposes techniques of separation and transfer, which is described in Reference 3 (Japanese Published Patent Application No. 2003-174153). In Reference 3, a technique is described in which, in forming a metal layer (Ti, Al, Ta, W, Mo, Cu, Cr, Nd, Fe, Ni, Co, Ru, Rh, Pd, Os, or Ir) over a substrate and stacking an oxide layer thereover, a metal oxide layer of the metal layer is formed at the interface between the metal layer and the oxide layer, and the metal oxide layer is utilized for separation in a subsequent step.

SUMMARY OF THE INVENTION

Meanwhile, in order to add various functions to a semiconductor device, it is inevitably necessary to increase the circuit size and the capacity of memory of an integrated circuit included in a semiconductor device. However, as the circuit size or the capacity of memory is increased, the occupied area of the integrated circuit included in the semiconductor device tends to increase. Accordingly, reliability of the semiconductor device with respect to force which is externally applied (external force) is reduced, resulting in a problem in that the above-described advantage in that the substrate having flexibility can be expected to have various applications cannot be sufficiently taken. Further, even when the area of the semiconductor device is not changed, room for improvement in reliability with respect to pressure which is externally and locally applied (pressing force) has been left in the case of using the substrate having flexibility.

In view of the foregoing problems, it is an object of the present invention to provide a semiconductor device which can increase reliability with respect to external force, especially pressing force, while the circuit size or the capacity of memory is maintained.

The present inventors focus attention on a structure body in which a fibrous body of an organic compound or an inorganic compound is impregnated with an organic resin, and have found that reliability of a semiconductor device with respect to external force, especially pressing force, is dramatically increased when an element layer including a semiconductor element formed using a thin semiconductor film is provided between a pair of structure bodies each having a stack of the plurality of fibrous bodies, especially the plurality of fibrous bodies including three or more layers.

In specific, a semiconductor device of the present invention includes a pair of structure bodies each having a stack of fibrous bodies of an organic compound or an inorganic compound, which includes a plurality of layers, especially three or more layers, is impregnated with an organic resin; and an element layer provided between the pair of structure bodies. The element layer and the structure body can be fixed to each other by heating and pressure bonding. Further, a layer for fixing the element layer and the structure body may be provided. Alternatively, the structure body fixed to an element layer can be formed in such a way that after a plurality of fibrous bodies are stacked over the element layer, the fibrous bodies are impregnated with an organic resin.

The thickness of the element layer is preferably greater than or equal to 1 µm and less than or equal to 10 µm, furthermore greater than or equal to 1 µm and less than or equal to 5 µm. The total thickness of the pair of structure bodies is preferably greater than or equal to 20 µm and less than or equal to 100 µm. With such a thickness, a semiconductor device which can be curved can be manufactured.

As the fibrous body, a woven fabric or a nonwoven fabric which uses a high-strength fiber of an organic compound or an inorganic compound is used. A high-strength fiber is specifically a fiber with a high tensile modulus of elasticity or a fiber with a high Young's modulus. By using a high-strength fiber for the fibrous body, even when local pressing force is applied to a semiconductor device, the pressure is dispersed throughout the fibrous body; accordingly, partial stretching of the semiconductor device can be prevented. That is, destruction of a wiring, a semiconductor element, or the like, which is caused by the partial stretching, can be prevented.

Further, as the organic resin, a thermoplastic resin or a thermosetting resin can be used.

According to the present invention, a highly-reliable semiconductor device which is not easily damaged by external force, especially pressing force, can be manufactured with a high yield.

BRIEF DESCRIPTION OF THE DRAWINGS

In the accompanying drawings:

FIGS. 7A and 7B illustrate a manufacturing method of a semiconductor device of the present invention;

DETAILED DESCRIPTION OF THE INVENTION

Embodiment Mode

Embodiment modes of the present invention will be described below with reference to drawings. However, the present invention can be implemented in various different modes, and it is easily understood by those skilled in the art that various changes and modifications of the modes and details are possible, unless such changes and modifications depart from the content and the scope of the invention. Therefore, the present invention is not construed as being limited to the description of the following embodiment modes.

Embodiment Mode 1

Figure 1:
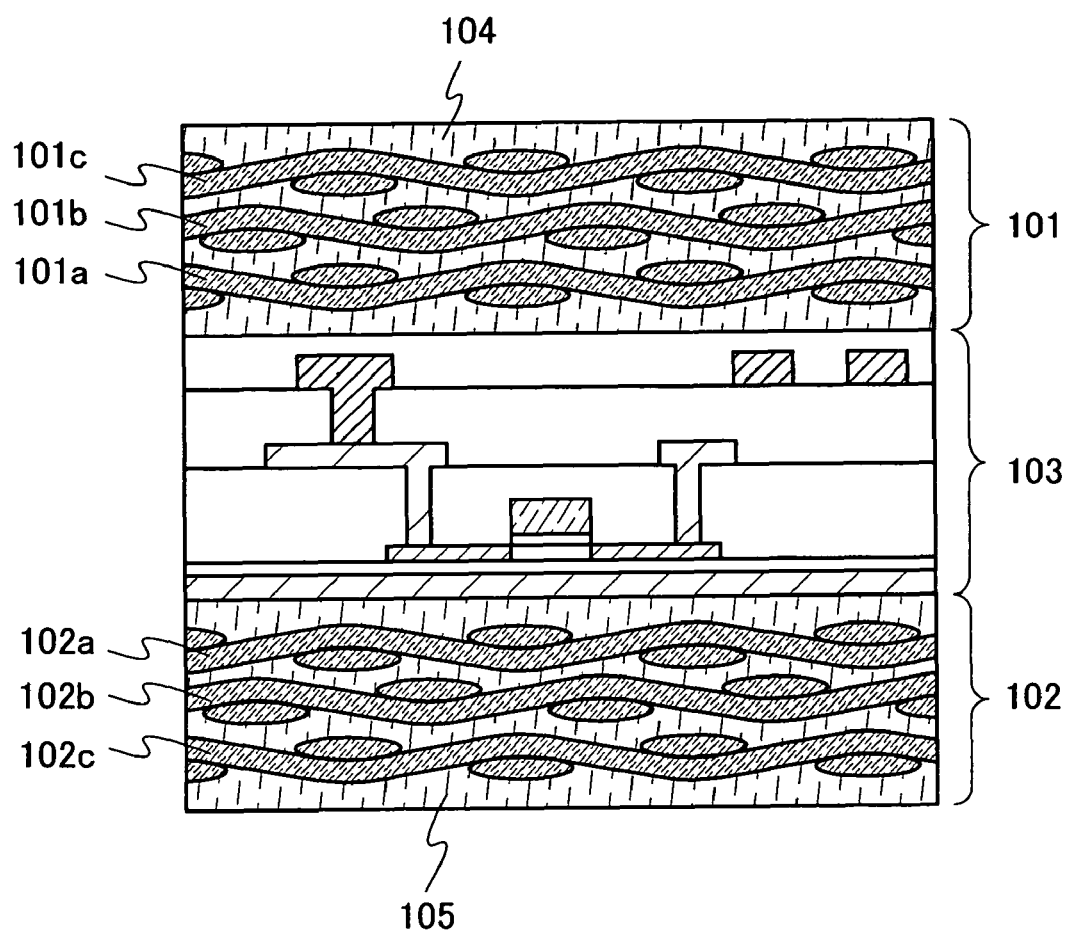
FIG. 1 is a cross-sectional view of a semiconductor device of the present invention.

FIG. 1 shows an example of a cross-sectional view of a semiconductor device of the present invention. The semiconductor device shown in FIG. 1 includes a structure body 101, a structure body 102, and an element layer 103 provided between the pair of structure bodies 101 and 102. The structure body 101 includes a fibrous body 101a, a fibrous body 101b, and a fibrous body 101c each of which is formed from an organic compound or an inorganic compound; and an organic resin 104 with which the fibrous bodies 101a to 101c are impregnated. The fibrous body 101a, the fibrous body 101b, and the fibrous body 101c are stacked. Similarly, the structure body 102 includes a fibrous body 102a, a fibrous body 102b, and a fibrous body 102c each of which is formed from an organic compound or an inorganic compound; and an organic resin 105 with which the fibrous bodies 102a to 102c are impregnated. The fibrous body 102a, the fibrous body 102b, and the fibrous body 102c are stacked.

Although this embodiment mode describes the case where each structure body has a stack of fibrous bodies which includes three layers, the present invention is not limited to this structure. Each structure body may have a stack of fibrous bodies which includes two layers or a stack of fibrous bodies which includes four or more layers. Further, the structure body 101 and the structure body 102 may differ from each other in the number of included fibrous bodies.

Although the element layer 103 is directly fixed to the structure bodies 101 and 102 in FIG. 1, the element layer 103 may be fixed to the structure bodies 101 and 102 with an adhesive layer serving as an adhesive.

The thickness of the structure body 101 and the thickness of the structure body 102 are set to be almost the same, specifically, the ratio of the thickness of one of structure bodies to the thickness of the other of the structure bodies is set to be greater than or equal to 0.8 and less than or equal to 1.2, and the organic resin 104 and the organic resin 105 are formed from the same material. Accordingly, warpage of the semiconductor device can be reduced. Further, the thicknesses of the structure body 101 and the thickness of the structure body 102 are set to be almost the same, specifically, the ratio of the thickness of one of structure bodies to the thickness of the other of the structure bodies is set to be greater than or equal to 0.8 and less than or equal to 1.2. Accordingly, pressure can be prevented from being locally applied to the element layer 103 provided between the structure body 101 and the structure body 102 when the semiconductor device is bent by application of stress; thus, reliability of the semiconductor device can be increased.

Specifically, the total thickness of the structure body 101 and the structure body 102 which are superposed is desirably greater than or equal to 20 μm and less than or equal to 100 μm. When a structure body with the above-described thickness is used, a thin semiconductor device capable of being curved can be manufactured.

A thermosetting resin such as an epoxy resin, an unsaturated polyester resin, a polyimide resin, a bismaleimide-triazine resin, or a cyanate resin can be used for the organic resin 104 and the organic resin 105. Alternatively, a thermoplastic resin such as a polyphenylene oxide resin, a polyetherimide resin, or a fluorine resin can be used for the organic resin 104 and the organic resin 105. Further alternatively, a plurality of resins selected from the above-described thermosetting resin and thermoplastic resin may be used as the organic resin 104 and the organic resin 105. When the above-described organic resin is used, the fibrous body can be fixed to the element layer 103 by heat treatment. The higher the glass transition temperature of the organic resin 104 and the organic resin 105 is, the less the organic resin 104 and the organic resin 105 are destroyed by local pressing force, which is preferable.

Highly thermally-conductive filler may be dispersed in the organic resins 104 and 105 or the yarn bundles of fibers. As the highly thermally-conductive filler, aluminum nitride, boron nitride, silicon nitride, alumina, or the like can be given. As the highly thermally-conductive filler, metal particles of silver, copper, or the like can also be given. When the highly thermally-conductive filler is included in the organic resin or the yarn bundles of fibers, heat generated in the element layer 103 can be easily released to the outside. Accordingly, thermal storage in the semiconductor device can be suppressed, and destruction of the semiconductor device can be reduced.

Each of the fibrous bodies 101a to 101c and the fibrous bodies 102a to 102c is a woven fabric or a nonwoven fabric which uses high-strength fibers of an organic compound or an inorganic compound. The fibrous bodies 101a to 101c and the fibrous bodies 102a to 102c are disposed to cover two main surfaces of the element layer 103. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As the glass fiber, a glass fiber using E glass, S glass, D glass, Q glass, and the like can be given. It is to be noted that the fibrous bodies 101a to 101c and the fibrous bodies 102a to 102c may be formed from one kind of the above-described high-strength fibers or a plurality of the above-described high-strength fibers.

The fibrous bodies 101a to 101c and the fibrous bodies 102a to 102c may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in its cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Use of a yarn bundle having an elliptical shape or a flat shape in its cross section as described above can make the fibrous bodies 101a to 101c and the fibrous bodies 102a to 102c thin. Accordingly, the structure body 101 and the structure body 102 can be made thin, and thus, a thin semiconductor device can be manufactured. An effect of the present invention is achieved when the diameter of the yarn bundle is greater than or equal to 4 μm and less than or equal to 400 μm, furthermore greater than or equal to 4 μm and less than or equal to 200 μm. Theoretically, the diameter of the yarn bundle may be even smaller than that. Further, an effect of the present invention is achieved when the thickness of the fiber is greater than or equal to 4 μm and less than or equal to 20 μm. Theoretically, the thickness of the fiber may be even smaller than that, and the thickness of the fiber depends on a material of the fiber.

It is to be noted that in the drawings of this specification, the fibrous bodies 101a to 101c and the fibrous bodies 102a to 102c are shown as woven fabrics which are plain-woven using yarn bundles each having an elliptical shape in its cross section.

Figure 4A:
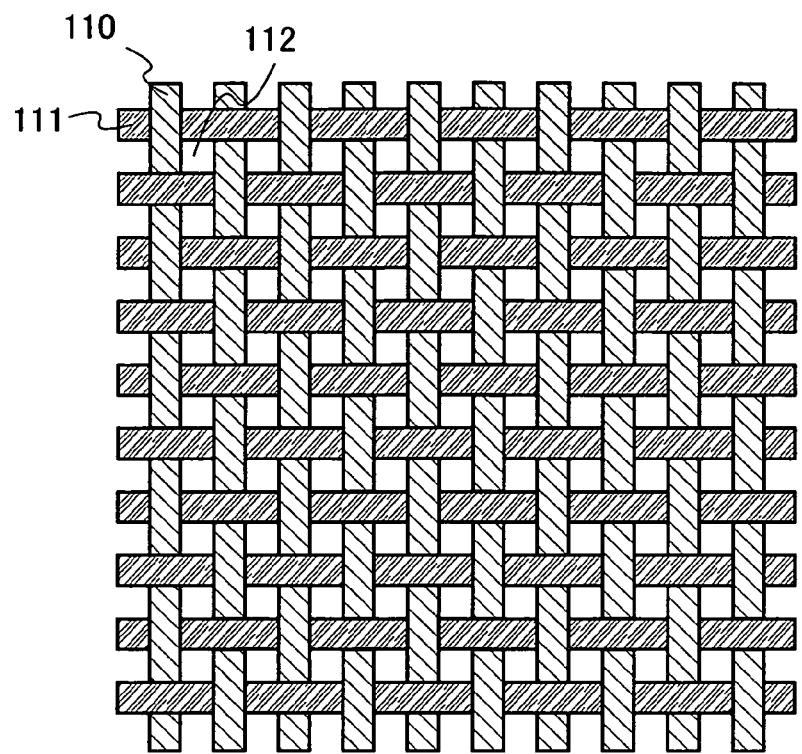
FIGS. 4A and 4B each illustrate a structure of a fibrous body.
Figure 4B:
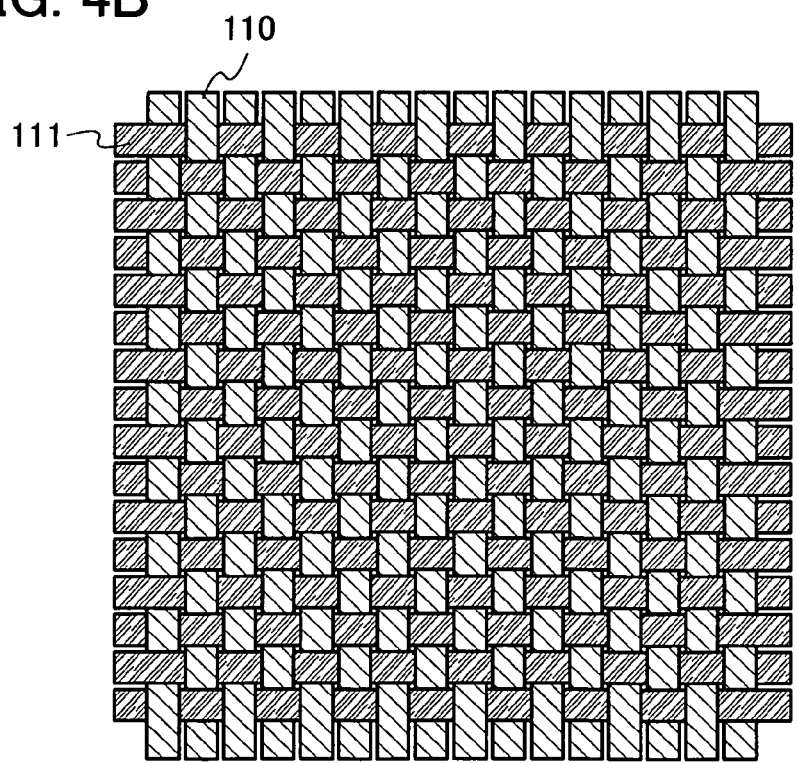

FIGS. 4A and 4B show top views of the fibrous bodies 101a to 101c and the fibrous bodies 102a to 102c which are woven fabrics woven using yarn bundles of fibers for warp yarns and weft yarns.

As shown in FIG. 4A, the fibrous bodies 101a to 101c and the fibrous bodies 102a to 102c are woven using warp yarns 110 spaced at regular intervals and weft yarns 111 spaced at regular intervals. Such a fibrous body which is woven using the warp yarns 110 and the weft yarns 111 has regions without the warp yarns 110 and the weft yarns 111 (basket holes 112). In such fibrous bodies 101a to 101c and fibrous bodies 102a to 102c, the organic resin 104 or 105 is further impregnated, whereby adhesion between the element layer 103 and the fibrous bodies 101a to 101c and 102a to 102c can be further increased.

As shown in FIG. 4B, in each of the fibrous bodies 101a to 101c and the fibrous bodies 102a to 102c, density of the warp yarns 110 and the weft yarns 111 may be high and the proportion of the basket holes 112 may be low. Typically, the size of the basket hole 112 is preferably smaller than the area of a locally pressed portion. Typically, the basket hole 112 preferably has a rectangular shape having a side with a length greater than or equal to 0.01 mm and less than or equal to 0.2 mm. When the basket hole 112 of each of the fibrous bodies 101a to 101c and the fibrous bodies 102a to 102c has such a small area, even when the fibrous bodies 101a to 101c and the fibrous bodies 102a to 102c are pressed by a member with a sharp tip (typically, a writing material such as a pen or a pencil), the pressure can be absorbed by the entire fibrous bodies 101a to 101c and the fibrous bodies 102a to 102c.

Further, in order to enhance permeability of an organic resin into the inside of the yarn bundle of fibers, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

The element layer 103 has a semiconductor element formed using a thin semiconductor film. In specific, as semiconductor elements, active elements such as thin film transistors, diodes, and nonvolatile memory elements, and passive elements such as resistors and capacitors can be given. As thin semiconductor films, single-crystal semiconductor films formed using an SOI technology, polycrystalline semiconductor films, amorphous semiconductor films, microcrystalline semiconductor films, and the like are given. As a semiconductor, silicon, germanium, a silicon-germanium compound, or the like can be used. Alternatively, as a semiconductor, metal oxide or an organic semiconductor can be used. As the metal oxide, zinc oxide, oxide of zinc-gallium-indium, and the like can be given, for example.

The thickness of the element layer 103 is preferably greater than or equal to 1 μm and less than or equal to 10 μm, more preferably greater than or equal to 1 μm and less than or equal to 5 μm. When the element layer 103 has such a thickness, a semiconductor device capable of being curved can be manufactured.

Figure 5A:
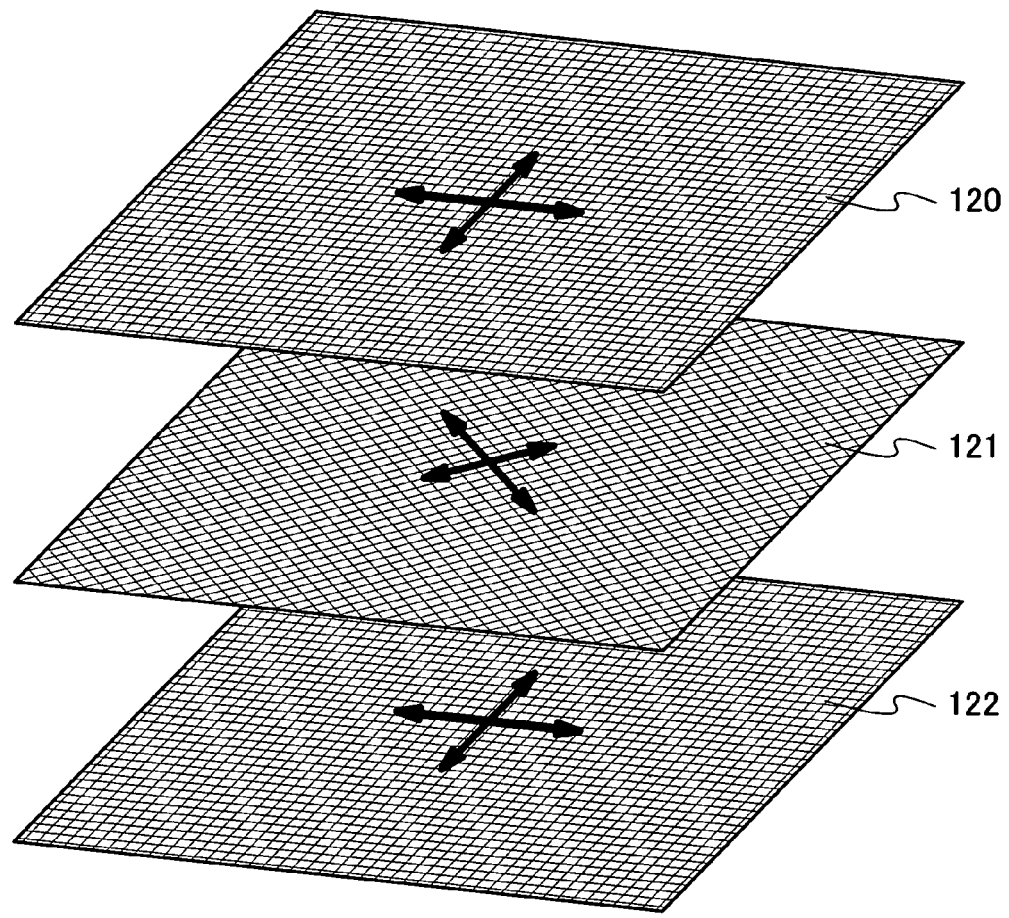
FIG. 5A illustrates a state where a plurality of fibrous bodies are superposed on each other in a given order.

In the case where each of the fibrous bodies 101a to 101c and the fibrous bodies 102a to 102c is a woven fabric formed using warp yarns and weft yarns, the fibrous bodies may have different directions of the warp yarns and the weft yarns. FIG. 5A shows the state where fibrous bodies 120 to 122 having different directions of the warp yarns and the weft yarns are superposed on each other in a given order. The arrows indicate the directions of the warp yarns and the weft yarns which are included in the respective fibrous bodies 120 to 122. In FIG. 5A, the warp yarns and the weft yarns of the fibrous body 120 are almost in the same direction as those of the fibrous body 122. The directions of the warp yarns and the weft yarns of the fibrous body 121 are different from that of the fibrous body 120 and the fibrous body 122 by 45°.

Figure 5B:
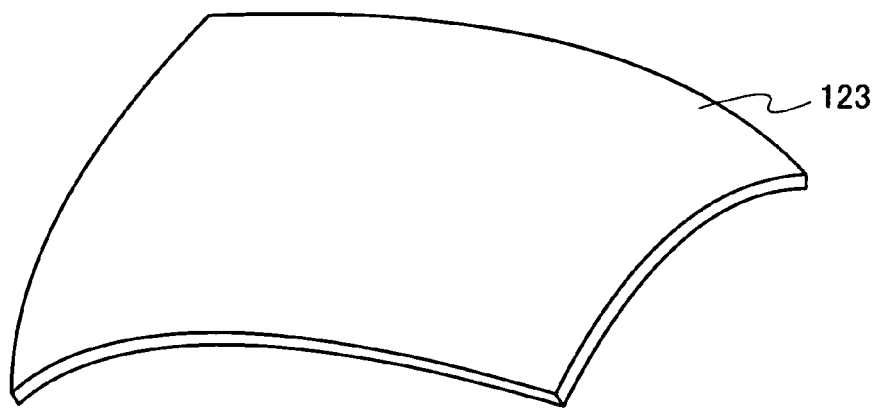
FIG. 5B is an external view of a semiconductor device which is bent by stress.

When a plurality of fibrous bodies have different directions of the warp yarns and the weft yarns in this manner, reliability of a semiconductor device 123 can be secured even when the semiconductor device 123 is bent in any direction as shown in FIG. 5B. Further, in applying pressing force, the fibrous body has tensile directions which are different between opposing sides; accordingly, extension in locally pressing becomes isotropic. Thus, destruction of a semiconductor device due to the pressing can be further reduced. The directions of the warp yarns and the weft yarns of fibrous bodies are desirably different from each other by 30° or more and 60° or less, especially 40° or more and 50° or less. It is to be noted that the directions of the warp yarns and the weft yarns of fibrous bodies in one structure body may be different from each other, or the directions of the warp yarns and the weft yarns of fibrous bodies may be different between a pair of structure bodies.

In a structure body used in the present invention, a high-strength fiber with a high tensile modulus of elasticity or with a high Young's modulus is used as a fibrous body. Accordingly, even when local pressing force such as point pressure or linear pressure is applied, pressing force is dispersed throughout the fibrous body. Therefore, a semiconductor element, a wiring, and the like which are included in an element layer are not cracked, and thus, a semiconductor device can be prevented from being destroyed. Further, because a thin semiconductor film is formed, an element layer can be made thin. Therefore, unlike the case of using a bulk semiconductor element, a semiconductor device is not easily destroyed even when the semiconductor device is curved.

A semiconductor device included in the category of the present invention includes various kinds of semiconductor devices such as microprocessors, integrated circuits such as image processing circuits, RF tags, and semiconductor display devices. As for the semiconductor display device of the present invention, a liquid crystal display device, a light-emitting device provided with pixels each including a light-emitting element typified by an organic light-emitting diode (OLED), a DMD (digital micromirror device), a PDP (plasma display panel), an FED (field emission display), and the like and another display device in which a circuit element using a semiconductor film is included in a driver circuit are included in its category.

Embodiment Mode 2

The proportion of operating semiconductor devices at the time of applying local pressing force with a pen was tested by the present inventors.

In the test, an RF tag was used as a semiconductor device. It is to be noted that an RF tag is a recording medium used for technique to identify individuals by transmission and reception of signals wirelessly (RFID: radio frequency identification), and signals can be transmitted and received without contact between the RF tag and an interrogator called a reader or a reader/writer. Most of the RF tags are shaped like a card or shaped like a chip with the size smaller than a card; however, the RF tags may be variously shaped.

The test was conducted on an RF tag in which an element layer was interposed between a pair of prepregs each having a fibrous body of one layer (a sample A), an RF tag in which an element layer was interposed between a pair of prepregs each having fibrous bodies of two layers (a sample B), and an RF tag in which an element layer was interposed between a pair of prepregs each having fibrous bodies of three layers (a sample C). Further, as comparative objects, an RF tag in which an element layer was interposed between a pair of prepregs each having a fibrous body of one layer and having a thickness of 17 µm (a sample D) and an RF tag in which an element layer was interposed between a pair of prepregs each having a fibrous body of one layer and having a thickness of 35 µm (sample E) were also prepared, and the test was conducted on the samples D and E together with the samples A to C.

To clarify the structure of each sample, the cross-sectional structures of the samples A, B, C, D, and E are shown in FIGS. 3A, 3B, 3C, 3D, and 3E, respectively.

Figure 3A:
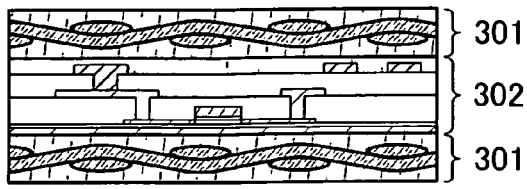
FIGS. 3A to 3E are cross-sectional views of samples A to E.
Figure 3B:
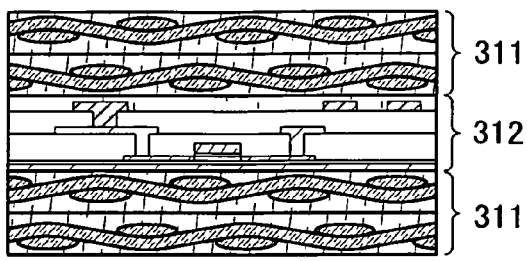
Figure 3C:
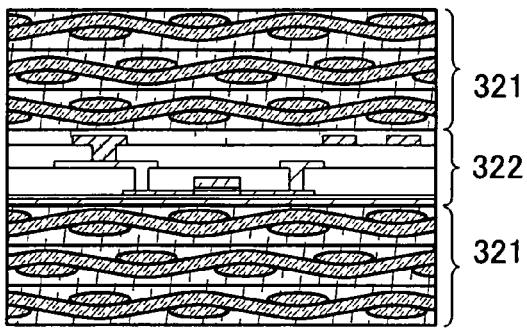
Figure 3D:
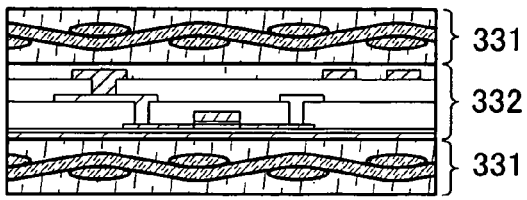
Figure 3E:
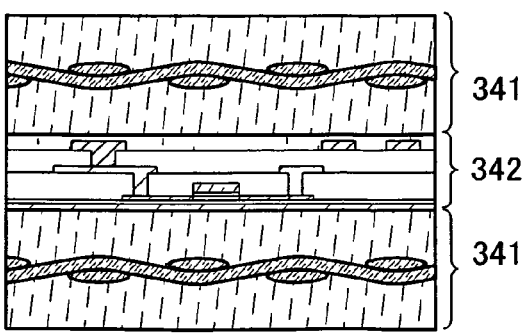

In the sample A shown in FIG. 3A, the thickness of each prepreg 301 which had not been subjected to heating and pressure bonding was 15 µm. Further, the total thickness of the sample A was 27 to 28 µm, which was formed in such a way that the pair of prepregs 301 was subjected to heating and pressure bonding with an element layer 302 interposed therebetween. In the sample B shown in FIG. 3B, each prepreg 311 was formed in such a way that a stack of the prepregs 301 which includes two layers is subjected to heating and pressure bonding, where the prepreg 301 had a thickness of 15 µm and was the same type as in the sample A. Further, the total thickness of the sample B was 56 to 65 µm, which was formed in such a way that the pair of prepregs 311 was subjected to heating and pressure bonding with an element layer 312 interposed therebetween. In the sample C shown in FIG. 3C, each prepreg 321 was formed in such a way that a stack of the prepregs 301 which includes three layers was subjected to heating and pressure bonding, where the prepreg 301 had a thickness of 15 µm and was the same type as in the sample A. Further, the total thickness of the sample C was 76 to 78 µm, which was formed in such a way that the pair of prepregs 321 was subjected to heating and pressure bonding with an element layer 322 interposed therebetween. In the sample D shown in FIG. 3D, the thickness of each prepreg 331 which had not been subjected to heating and pressure bonding was 17 µm. Further, the total thickness of the sample D was 40 to 44 µm, which was formed in such a way that the pair of prepregs 331 was subjected to heating and pressure bonding with an element layer 332 interposed therebetween. In the sample E shown in FIG. 3E, the thickness of each prepreg 341 which had not been subjected to heating and pressure bonding was 35 µm. Further, the total thickness of the sample E was 69 to 78 µm, which was formed in such a way that the pair of prepregs 341 was subjected to heating and pressure bonding with an element layer 342 interposed therebetween.

The total thickness of each of the samples A to E varies because pressure which is applied at the time of heating and pressure bonding varies depending on a position.

The ratio of volume of the fibrous body included in each sample was as follows: approximately 28% in the sample A, approximately 29% in the sample B, approximately 33% in the sample C, approximately 20% in the sample D, and approximately 21% in the sample E. Further, in each of the samples A to E, the area of an RF tag was 10.5 mm×12.0 mm, and the fibrous body was woven using warp yarns and weft yarns by plain weave.

Figure 2:
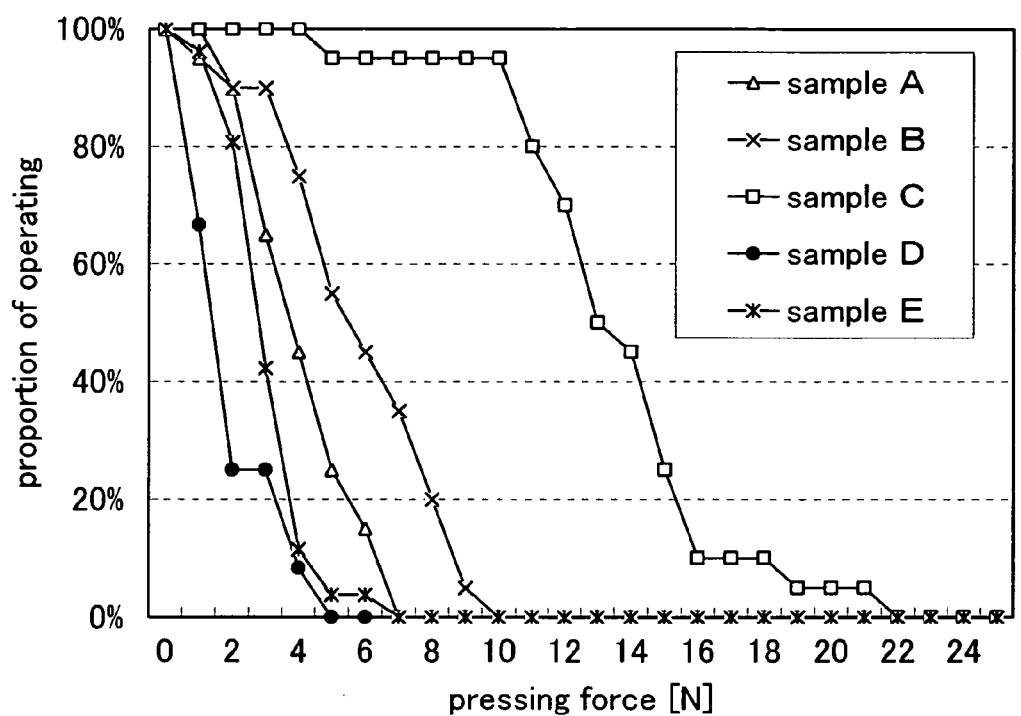
FIG. 2 is a graph showing the proportion of operating samples with respect to pressing force.

FIG. 2 shows the proportion of operating samples A to E in applying load (newton) to the samples A to E by using a pen with a tip which is hemisphere with a diameter of 1 mm. In each of the RF tags of the samples A to E, an antenna is incorporated in an element layer; and load was applied so that the tip of the pen touches a region where a digital circuit is formed but the antenna is not formed. It is to be noted that the number of tested RF tags is as follows: 20 as the samples A; 20 as the samples B; 20 as the samples C; 12 as the samples D; and 26 as the samples E. The proportion of operating samples was calculated from the proportion of RF tags from which data can be read without contact.

The proportions of operating samples A to C which are shown in FIG. 2 are compared. From the comparison, it is found that the proportion of the operating samples C is the highest and the proportion of the operating samples A is the lowest. In particular, the proportion of the operating samples C is dramatically higher than that of the operating samples B. Further, the proportion of the operating samples C is higher than that of the operating samples E though the total thickness of the sample C and the total thickness of the sample E are almost the same. From these results, it is found that the higher the ratio of volume of a fibrous body included in a prepreg is, the higher the proportion of the operating samples becomes. It is also found that the dramatically high proportion of the operating samples is obtained when the ratio of volume is made high and fibrous bodies of a plurality of layers, especially three or more layers are stacked.

Embodiment Mode 3

This embodiment mode describes a manufacturing method of a semiconductor device of the present invention. Although this embodiment mode describes a thin film transistor (TFT) as an example of a semiconductor element, a semiconductor element used for a semiconductor device of the present invention is not limited thereto. For example, a memory element, a diode, a resistor, a coil, a capacitor, an inductor, or the like can be used as well as a TFT.

Figure 6A:
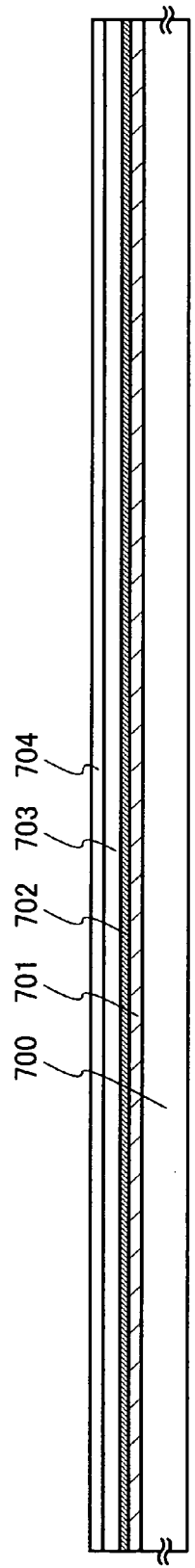
FIGS. 6A to 6C illustrate a manufacturing method of a semiconductor device of the present invention.

First, as shown in FIG. 6A, an insulating film 701, a separation layer 702, an insulating film 703, and a semiconductor film 704 are sequentially formed over a substrate 700 having heat resistance. The insulating film 701, the separation layer 702, the insulating film 703, and the semiconductor film 704 can be successively formed.

As the substrate 700, a glass substrate such as barium borosilicate glass or aluminoborosilicate glass, a quartz substrate, a ceramic substrate, or the like can be used. Alternatively, a metal substrate including a stainless steel substrate or a semiconductor substrate such as a silicon substrate may be used. A substrate formed from a synthetic resin which has flexibility, such as plastic, generally tends to have lower allowable temperature limit than the above substrates; however, the substrate can be used as long as it can resist a processing temperature in a manufacturing process.

As a plastic substrate, polyester typified by polyethylene terephthalate (PET); polyether sulfone (PES); polyethylene naphthalate (PEN); polycarbonate (PC); a polyamide synthetic fiber; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; or the like can be used.

Although the separation layer 702 is provided over an entire surface of the substrate 700 in this embodiment mode, the present invention is not limited to this structure. For example, the separation layer 702 may be formed partly over the substrate 700 by a photolithography method or the like.

The insulating films 701 and 703 are formed using an insulating material such as silicon oxide, silicon nitride (e.g., $SiN_x$ or $Si_3N_4$), silicon oxynitride ($SiO_xN_y$ where x>y>0), or silicon nitride oxide ($SiN_xO_y$ where x>y>0) by a CVD method, a sputtering method, or the like.

The insulating films 701 and 703 are provided to prevent an alkali metal such as Na and an alkaline-earth metal which are contained in the substrate 700 from diffusing into the semiconductor film 704 and adversely affecting characteristics of semiconductor elements such as TFTs. In addition, the insulating film 703 serves to prevent an impurity element contained in the separation layer 702 from diffusing into the semiconductor film 704, and also serves to protect the semiconductor elements in a later step of separating the semiconductor elements. Further, the insulating film 703 facilitates separation in the separation layer 702 or can prevent the semiconductor elements and wirings from being cracked or damaged in a later step of separating the semiconductor elements.

Each of the insulating films 701 and 703 can be either a single insulating film or stacked layers of a plurality of insulating films. In this embodiment mode, the insulating film 703 is formed by sequentially stacking a silicon oxynitride film having a thickness of 100 nm, a silicon nitride oxide film having a thickness of 50 nm, and a silicon oxynitride film having a thickness of 100 nm. However, the material and thickness of each film as well as the number of stacked films are not limited to this example. For example, the silicon oxynitride film in the lower layer may be replaced with a siloxane-based resin having a thickness of 0.5 to 3 μm that is formed by a spin coating method, a slit coating method, a droplet discharge method, a printing method, or the like. In addition, the silicon nitride oxide film in the middle layer may be replaced with a silicon nitride film. Further, the silicon oxynitride film in the upper layer may be replaced with a silicon oxide film. The thickness of each film is preferably from 0.05 to 3 μm, and can be freely selected within this range.

Alternatively, it is also possible to form the lower layer of the insulating film 703, which is closest to the separation layer 702, using a silicon oxynitride film or a silicon oxide film, to form the middle layer thereof using a siloxane-based resin, and to form the upper layer thereof using a silicon oxide film.

It is to be noted that a siloxane-based resin is a resin formed from a siloxane-based material as a starting material and having the bond of Si—O—Si. A siloxane-based resin may contain at least one kind of fluorine, an alkyl group, and aromatic hydrocarbon, in addition to hydrogen as a substituent.

The silicon oxide film can be formed using a mixed gas such as $SiH_4/O_2$, TEOS (tetraethoxysilane)/$O_2$, or the like by a thermal CVD method, a plasma CVD method, an atmospheric pressure CVD method, a bias ECRCVD method, or the like. The silicon nitride film can be typically formed using a mixed gas of $SiH_4$ and $NH_3$ by a plasma CVD method. The silicon oxynitride film and the silicon nitride oxide film can be typically formed using a mixed gas of $SiH_4$ and $N_2O$ by a plasma CVD method.

For the separation layer 702, it is possible to use a metal film, a metal oxide film, or a stacked film of a metal film and a metal oxide film. The metal film and the metal oxide film may each have either a single layer or a stacked structure of a plurality of layers. As an alternative to a metal film or a metal oxide film, metal nitride or metal oxynitride may alternatively be used. The separation layer 702 can be formed by a sputtering method or various CVD methods such as a plasma CVD method.

Examples of metals used for the separation layer 702 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like. The separation layer 702 may alternatively be formed using a film made of an alloy containing any of the above-described metals as a main component or a film made of a compound containing any of the above-described metals, as an alternative to a film formed from any of the above-described metals.

Alternatively, the separation layer 702 may be formed using a single silicon (Si) film or a film made of a compound containing silicon (Si) as a main component. Further alternatively, the separation layer 702 may be formed using a film made of an alloy of silicon (Si) and any of the above-described metals. A film containing silicon can have any of amorphous, microcrystalline, and polycrystalline structures.

The separation layer 702 can be either a single layer of any of the above-described films or stacked layers thereof. The separation layer 702 having a stack of a metal film and a metal oxide film can be formed by sequentially forming a base metal film and oxidizing or nitriding the surface of the metal film. Specifically, plasma treatment may be performed on the base metal film in an oxygen atmosphere or an $N_2O$ atmosphere, or heat treatment may be performed on the metal film in an oxygen atmosphere or an $N_2O$ atmosphere. Alternatively, oxidation of the metal film can be performed by forming a silicon oxide film or a silicon oxynitride film on the base metal film so as to be in contact with the base metal film. Similarly, nitridation can be performed by forming a silicon nitride oxide film or a silicon nitride film on the base metal film so as to be in contact with the base metal film.

As the plasma treatment for oxidation or nitridation of the metal film, it is possible to perform high-density plasma treatment with a plasma density of $1\times10^{11}$ cm$^{-3}$ or higher, preferably from $1\times10^{11}$ to $9\times10^{15}$ cm$^{-3}$, and with high frequency such as microwaves (e.g., a frequency of 2.45 GHz).

Although the separation layer 702 having a stack of a metal film and a metal oxide film can be formed by oxidizing the surface of the base metal film, it is also possible to sequentially form a metal film and a metal oxide film thereover. For example, in the case of using tungsten as a metal, a tungsten film is formed as a base metal film by a sputtering method, a CVD method, or the like, and then, plasma treatment is performed on the tungsten film. Accordingly, a tungsten film that is a metal film and a metal oxide film that is in contact with the metal film and is formed from oxide of tungsten can be formed.

It is to be noted that oxide of tungsten is represented by $WO_X$. X is in the range of from 2 to 3, inclusive. There are cases where X is 2 ($WO_2$), X is 2.5 ($W_2O_5$), X is 2.75 ($W_4O_{11}$), and X is 3 ($WO_3$). In formation of oxide of tungsten, there is no particular limitation on the value of X, and the value of X may be determined based on the etching rate or the like.

It is preferable that the semiconductor film 704 be consecutively formed after the formation of the insulating film 703 without exposure to air. A thickness of the semiconductor film 704 is 20 to 200 nm (desirably 40 to 170 nm, or preferably 50 to 150 nm). It is to be noted that the semiconductor film 704 may be an amorphous semiconductor, a semi-amorphous semiconductor, or a polycrystalline semiconductor. Further, not only silicon but also silicon germanium can be used for the semiconductor. In the case of using silicon germanium, a concentration of germanium is preferably about from 0.01 to 4.5 atomic %.

It is to be noted that a semi-amorphous semiconductor corresponds to a semiconductor having an intermediate structure between an amorphous semiconductor and a semiconductor having a crystalline structure (including a single crystal and a polycrystal). The semi-amorphous semiconductor corresponds to a semiconductor having a third condition which is stable in terms of free energy and corresponds to a crystalline substance having a short-range order and lattice distortion, and the semi-amorphous semiconductor having a crystal grain size of from 0.5 to 20 nm can be dispersed in a non-single crystalline semiconductor. As for the semi-amorphous semiconductor, Raman spectrum thereof is shifted to a wave number side lower than 520 cm$^{-1}$, and the diffraction peaks of (111) and (220) which are said to be caused by a Si crystal lattice are observed in X-ray diffraction. In addition, the semi-amorphous semiconductor film includes hydrogen or halogen of at least 1 atomic % or more to terminate a dangling bond. Here, such a semiconductor is referred to as a semi-amorphous semiconductor (SAS) for convenience. Further, a rare gas element such as helium, argon, krypton, or neon is included to further promote lattice distortion, so that stability is improved and thus an excellent semi-amorphous semiconductor can be obtained.

In addition, the SAS can be obtained by glow discharge decomposition of gas containing silicon. A typical example of gas containing silicon is $SiH_4$, and $Si_2H_6$, $SiH_2Cl_2$, $SiHCl_3$, $SiCl_4$, $SiF_4$, or the like may be used. The gas containing silicon is diluted with hydrogen, or gas in which one or more rare gas elements such as helium, argon, krypton, and neon are added to hydrogen, so that the SAS can be formed easily. It is preferable to use a dilution ratio of from 2 to 1000 times to dilute the gas containing silicon. Further, a carbide gas such as $CH_4$ or $C_2H_6$, a germanium gas such as $GeH_4$ or $GeF_4$, $F_2$, or the like may be mixed in the gas containing silicon to adjust an energy band width to be 1.5 to 2.4 eV or 0.9 to 1.1 eV.

For example, in the case of using a gas in which $H_2$ is added to $SiH_4$ or the gas in which $F_2$ is added to $SiH_4$, a subthreshold coefficient (subthreshold swing) of the TFT can be less than or equal to 0.35 V/dec, typically, from 0.25 to 0.09 V/dec, and a mobility can be 10 cm$^2$/sec when the TFT is manufactured using the formed semi-amorphous semiconductor.

It is to be noted that the semiconductor film 704 can be crystallized by a known technique. As a known crystallization method, there are a laser crystallization method with a laser beam and a crystallization method with a catalytic element. Alternatively, it is also possible to combine a crystallization method with a catalytic element and a laser crystallization method. In the case of using a thermally stable substrate such as quartz for the substrate 700, it is possible to combine any of the following crystallization methods: a thermal crystallization method with an electrically-heated oven, a lamp anneal crystallization method with infrared light, a crystallization method with a catalytic element, and high temperature annealing at about 950° C.

For example, in the case of using laser crystallization, heat treatment at 550° C. is applied to the semiconductor film 704 for four hours before the laser crystallization, in order to enhance the resistance of the semiconductor film 704 to a laser. When a continuous-wave solid-state laser is used and irradiation is conducted with the second to fourth harmonics of the fundamental wave, crystals with a large grain size can be obtained. Typically, the second harmonic (532 nm) or the third harmonic (355 nm) of an Nd:YVO$_4$ laser (the fundamental wave of 1064 nm) is preferably used. Specifically, a laser beam emitted from a continuous-wave YVO$_4$ laser is converted into a harmonic with a nonlinear optical element, so that a laser beam having an output power of 10 W is obtained. Then, the laser beam is preferably shaped into a rectangular shape or an elliptical shape with an optical system on the irradiation surface, so that the semiconductor film 704 is irradiated with the laser beam. In this case, a laser power density of about from 0.01 to 100 MW/cm$^2$ (preferably, from 0.1 to 10 MW/cm$^2$) is required, and irradiation is conducted with a scanning rate of about from 10 to 2000 cm/sec.

As a continuous-wave gas laser, an Ar laser, a Kr laser, or the like can be used. As a continuous-wave solid-state laser, the following can be used: a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, and the like.

Alternatively, the following pulsed lasers can be used, for example: an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, and a gold vapor laser.

A repetition rate of a pulsed laser beam may be set at 10 MHz or higher, so that laser crystallization may be performed with a considerably higher frequency band than the normally used frequency band of from several ten to several hundred Hz. It is said that it takes several ten to several hundred nsec for the semiconductor film 704 to become completely solidified after the semiconductor film 704 is melted by irradiation with a pulsed laser beam. Therefore, by using a laser beam with the above-described repetition rate, the semiconductor film 704 can be irradiated with the next pulsed laser beam after it is melted by the previous pulsed laser beam but before it becomes solidified. Accordingly, the solid-liquid interface of the semiconductor film 704 can be moved continuously and, thus, the semiconductor film 704 having crystal grains that have grown continuously in the scanning direction is formed. Specifically, it is possible to form an aggregation of crystal grains each having a width of about from 10 to 30 μm in the scanning direction and a width of about from 1 to 5 μm in the a direction perpendicular to the scanning direction. By forming single crystal grains that have continuously grown in the scanning direction, it is possible to form the semiconductor film 704 having few crystal grain boundaries at least in the channel direction of a TFT.

It is to be noted that laser crystallization can be performed by irradiation with a fundamental wave of a continuous-wave laser beam and a harmonic of a continuous-wave laser beam in parallel. Alternatively, laser crystallization may be performed by irradiation with a fundamental wave of a continuous-wave laser beam and a harmonic of a pulsed laser beam in parallel.

It is to be noted that laser irradiation can be performed in an inert gas atmosphere such as a rare gas or a nitrogen gas. Accordingly, roughness of the semiconductor surface by laser irradiation can be suppressed, and variations in threshold resulting from a variation in interface state density can be suppressed.

By the above-described laser irradiation, the semiconductor film 704 with enhanced crystallinity can be formed. It is to be noted that a polycrystalline semiconductor which is formed by a sputtering method, a plasma CVD method, a thermal CVD method, or the like, may be used for the semiconductor film 704.

Although the semiconductor film 704 is crystallized in this embodiment mode, it is not necessarily required to be crystallized and can remain as an amorphous silicon film or a microcrystalline semiconductor film to proceed to the following process. A TFT formed using an amorphous semiconductor or a microcrystalline semiconductor involves fewer fabrication steps than a TFT formed using a polycrystalline semiconductor. Therefore, it has an advantage of low cost and high yield.

The amorphous semiconductor can be obtained by glow discharge decomposition of a gas containing silicon. As the gas containing silicon, SiH$_4$ and Si$_2$H$_6$ are given. Those gases containing silicon may be used by being diluted with hydrogen, or hydrogen and helium.

Next, channel doping is performed, by which an impurity element imparting p-type conductivity or an impurity element imparting n-type conductivity is added at a low concentration to the semiconductor film 704. Channel doping may be performed to entire of the semiconductor film 704 or part of the semiconductor film 704 as selected. As the impurity element imparting p-type conductivity, boron (B), aluminum (Al), gallium (Ga), or the like can be used. As the impurity element imparting n-type conductivity, phosphorus (P), arsenic (As), or the like can be used. Here, boron (B) is used as the impurity element and added at a concentration of from $1\times10^{16}$ to $5\times10^{17}$/cm$^3$.

Figure 6B:
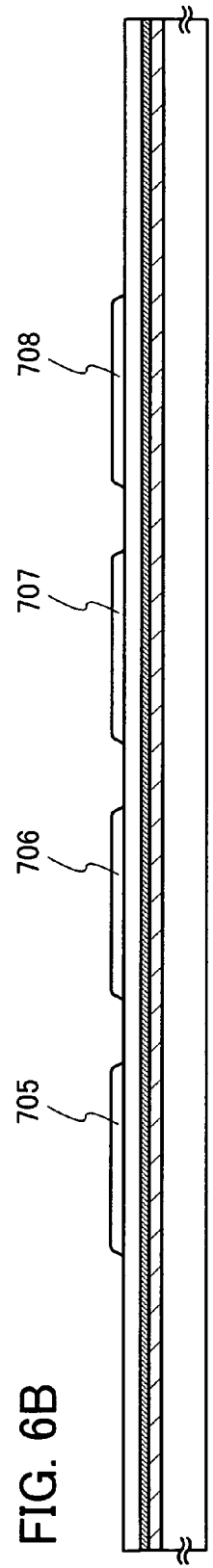
Figure 6C:
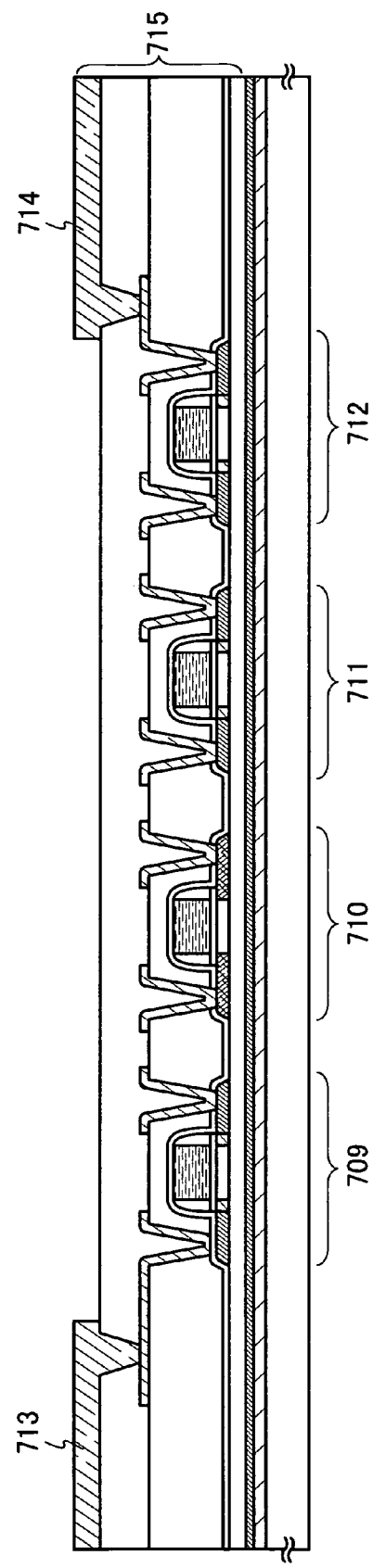

Next, as shown in FIG. 6B, the semiconductor film 704 is patterned to have predetermined shapes, so that island-shaped semiconductor films 705 to 708 are formed. As shown in FIG. 6C, semiconductor elements using the island-shaped semiconductor films 705 to 708, and wirings 713 and 714 which are connected to the semiconductor elements, are formed. This embodiment mode describes an example in which TFTs 709 to 712 are formed as the semiconductor elements. The TFT 709 and the TFT 712 are electrically connected to the wiring 713 and the wiring 714, respectively. An integrated circuit including the semiconductor elements, the wirings, and the like which are formed over the insulating film 703 corresponds to an element layer 715. The element layer 715 may include the insulating film 703.

As shown in FIG. 7A, a structure body 725 including a stack of a plurality of structure bodies in each of which a fibrous body 723 is impregnated with an organic resin 724 is superposed on the side which is not provided with the substrate 700. Such a structure body 725 is also referred to as a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured. A thickness of the structure body 725 is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured.

In this embodiment mode, a plurality of structure bodies in each of which a fibrous body of a single layer is impregnated with an organic resin is stacked to form the structure body 725. However, the present invention is not limited to this structure. A structure body may be used in which a stack of a plurality of fibrous bodies is impregnated with an organic resin. In stacking a plurality of structure bodies in each of which a fibrous body of a single layer is impregnated with an organic resin, another layer may be interposed between the structure bodies.

The structure body 725 are heated and subjected to pressure bonding so that the organic resin 724 of the structure body 725 is plasticized or cured. In the case where the organic resin 724 is an organic plastic resin, the organic resin which is plasticized is then cured by cooling the organic resin to room temperature. By heating and pressure bonding, the organic resin 724 is uniformly spread so as to be in close contact with the element layer 715, and is cured. A step in which the structure body 725 is subjected to pressure bonding is performed under an atmospheric pressure or a reduced pressure.

Then, as shown in FIG. 7B, the element layer 715 and the structure body 725 are separated from the substrate 700. In this embodiment mode, the element layer 715 and the structure body 725 are separated from the substrate 700 by using physical force. The separation layer 702 may partially remain without being entirely removed. The separation can be performed by pulling by a human hand or a gripping tool, or separating while rolling a roller.

Although this embodiment mode uses a method in which a metal oxide film is used for the separation layer and the element layer 715 is separated using physical means, a separation method used for the present invention is not limited thereto. For example, a method may be used in which a light-transmitting substrate 700 is used, amorphous silicon including hydrogen is used for the separation layer 702, the separation layer 702 is irradiated with a laser beam from the substrate 700 side to vaporize hydrogen included in the amorphous silicon, so that the substrate 700 is separated from the element layer 715.

The above-described separation may be performed by a method of etching the separation layer 702. In this case, a trench is formed so as to partly expose the separation layer 702. The trench is formed by dicing, scribing, and a process using a laser beam including UV light, a photolithography method, or the like. The trench may be deep enough to expose the separation layer 702. Further, halogen fluoride is used as an etching gas, and the gas is introduced through the trench. In this embodiment mode, etching is performed under the conditions of, for example, using $ClF_3$ (chlorine trifluoride), a temperature of 350° C., a flow rate of 300 sccm, an atmospheric pressure of 800 Pa, and a period of three hours. Alternatively, nitrogen may be mixed into the $ClF_3$ gas. Using halogen fluoride such as $ClF_3$ enables the separation layer 702 to be selectively etched, so that the substrate 700 can be separated from the element layer 715. It is to be noted that halogen fluoride may be either gas or liquid.

Alternatively, by a method of removing a substrate by mechanical polishing or a method of removing a substrate by dissolution of the substrate with a solution such as HF, the element layer 715 can be separated from the substrate 700. In this case, the separation layer 702 is not necessary.

Figure 8:
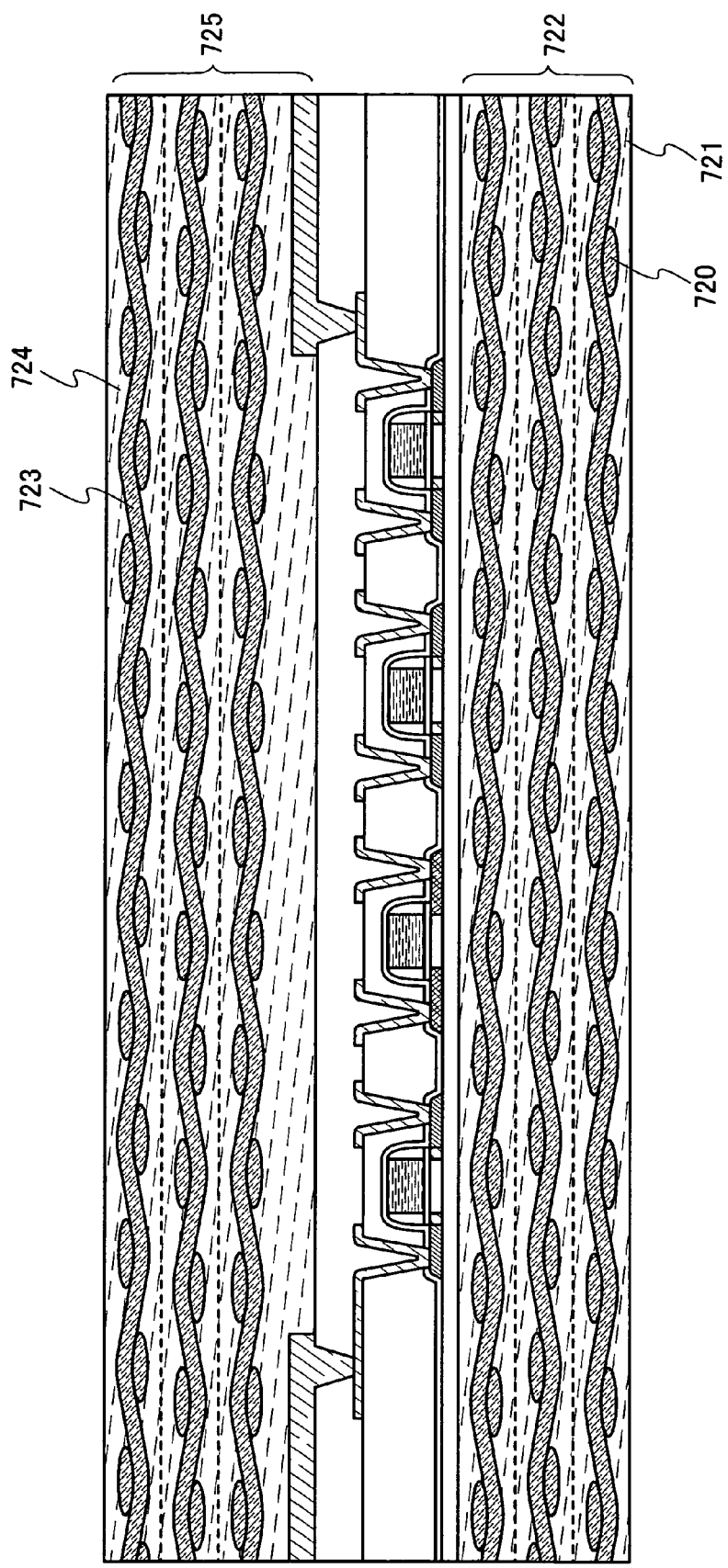
FIG. 8 illustrates a manufacturing method of a semiconductor device of the present invention.

As shown in FIG. 8, a structure body 722 including a stack of a plurality of structure bodies in each of which a fibrous body 720 is impregnated with an organic resin 721 is superposed on the side of the element layer 715 which is exposed by the above-described separation. Such a structure body 722 is also referred to as a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured. The thickness of the structure body 722 is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured.

In this embodiment mode, a plurality of structure bodies in each of which a fibrous body of a single layer is impregnated with an organic resin is stacked to form the structure body 722. However, the present invention is not limited to this structure. A structure body may be used in which a stack of a plurality of fibrous bodies is impregnated with an organic resin. In stacking a plurality of structure bodies in each of which a fibrous body of a single layer is impregnated with an organic resin, another layer may be interposed between the structure bodies.

The structure body 722 is heated and subjected to pressure bonding so that the organic resin 721 of the structure body 722 is plasticized or cured. In the case where the organic resin 721 is an organic plastic resin, the organic resin which is plasticized is then cured by cooling the organic resin to room temperature. By heating and pressure bonding, the organic resin 721 is uniformly spread so as to be in close contact with the element layer 715, and is cured. A step in which the structure body 722 is subjected to pressure bonding is performed under an atmospheric pressure or a reduced pressure.

Through the above-described process, the semiconductor device of the present invention is manufactured.

In the case where semiconductor elements corresponding to a plurality of semiconductor devices are formed between the structure body 722 and the structure body 725, the element layer 715 is divided for each semiconductor device. The division can be performed using a laser irradiation apparatus, a dicing apparatus, a scribing apparatus, a cutting machine having an edged tool such as scissors or a knife, or the like. In the case of using a laser irradiation apparatus, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaALAs, or InGaAsP laser. It is to be noted that a fundamental wave to a fifth harmonic are preferably used in a solid-state laser as appropriate.

In the case of having an antenna like an RF tag, an opening is formed in the structure body 722 or the structure body 725, so that the antenna and the integrated circuit included in the element layer 715 can be electrically connected to each other through the opening.

Figure 9:
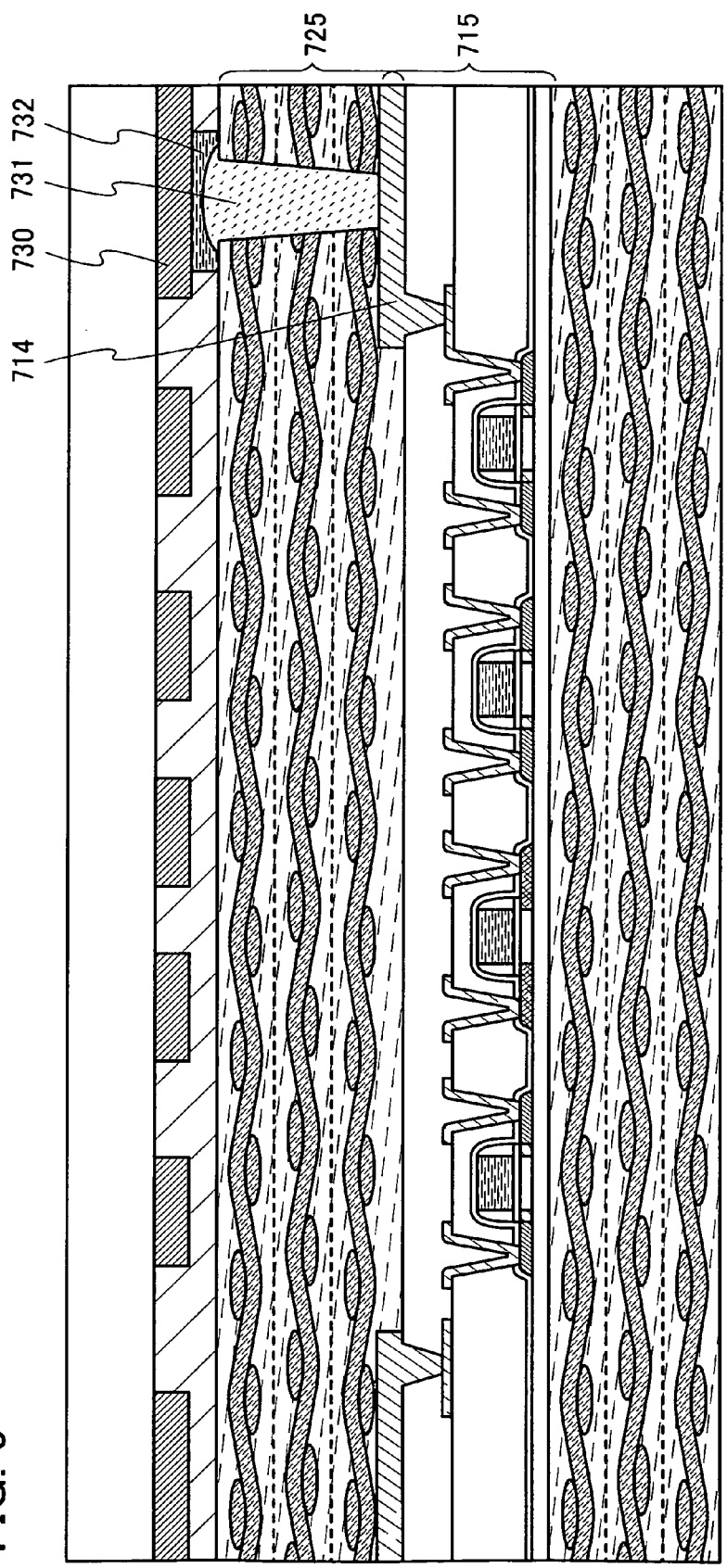
FIG. 9 illustrates a manufacturing method of a semiconductor device of the present invention.

FIG. 9 is a cross-sectional view of a semiconductor device in which an opening is formed in the structure body 725 with the use of a laser beam or the like and a connection terminal 731 connected to a wiring 714 in the element layer 715 is formed in the opening. The connection terminal 731 can achieve electrical connection by pressure bonding of an antenna 730 and the connection terminal 731 with the use of an anisotropic conductive film 732.

Figure 10:
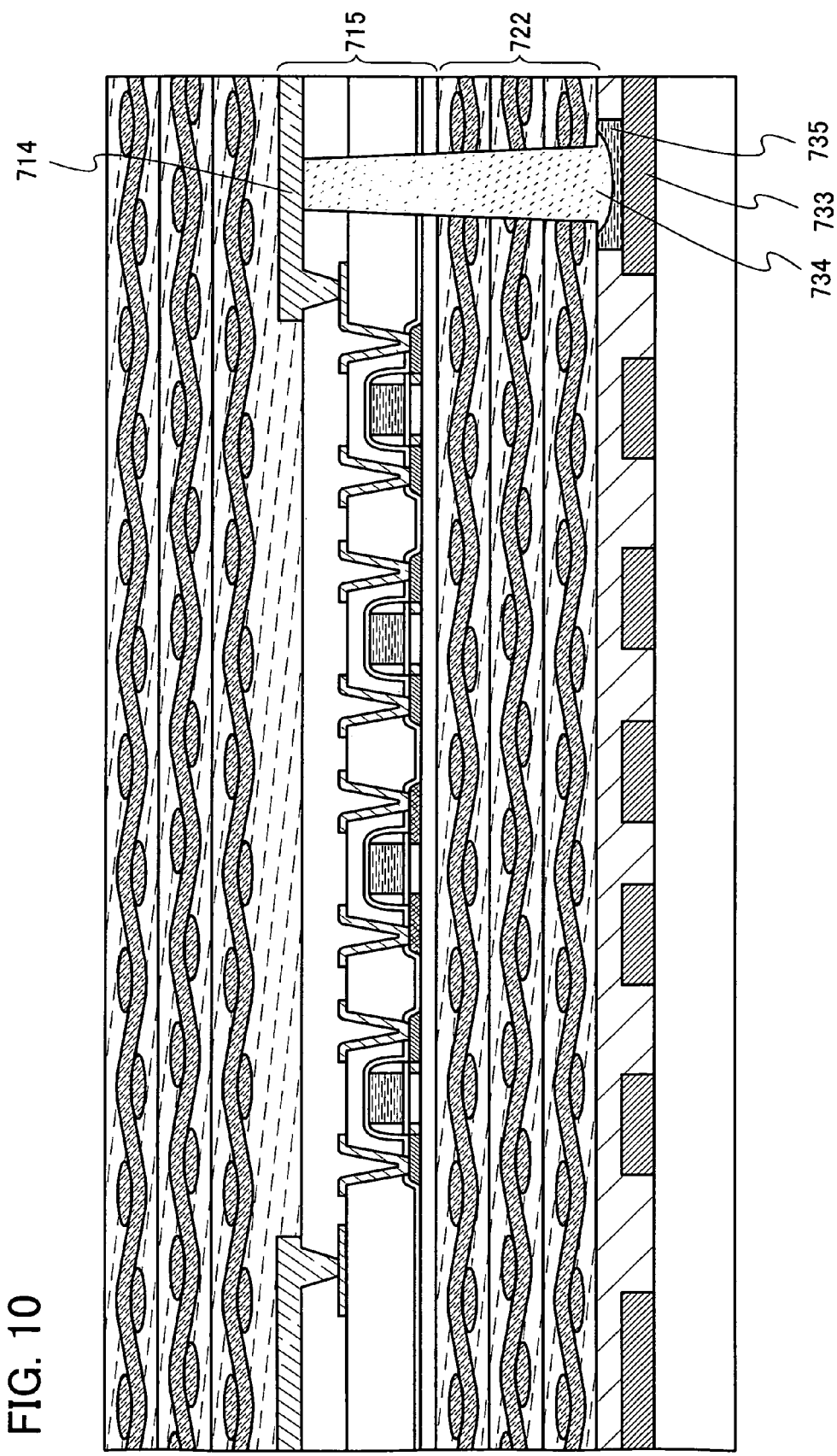
FIG. 10 illustrates a manufacturing method of a semiconductor device of the present invention.

FIG. 10 is a cross-sectional view of a semiconductor device in which an opening is formed in the structure body 722 with the use of a laser beam or the like and a connection terminal 734 connected to the wiring 714 in the element layer 715 is formed in the opening. The connection terminal 734 can achieve electrical connection by pressure bonding of an antenna 733 and the connection terminal 734 with the use of an anisotropic conductive film 735.

Connection between the antenna and the connection terminal may be performed by pressure bonding with an anisotropic conductive paste (ACP) or the like as an alternative to the anisotropic conductive film (ACF). Further, connection may be performed with a conductive adhesive such as a silver paste, a copper paste, or a carbon paste, soldering, or the like.

It is to be noted that, although the example in which the antenna which is separately formed is electrically connected to the element layer is described in this embodiment mode, the present invention is not limited to this structure. An antenna may be formed over the same substrate as an element layer and separated from the substrate together with the element layer, and the antenna and the element layer may be subjected to heating and pressure bonding to the structure body. The conductive film which serves as an antenna can be formed from a metal such as silver (Ag), gold (Au), copper (Cu), palladium (Pd), chromium (Cr), platinum (Pt), molybdenum (Mo), titanium (Ti), tantalum (Ta), tungsten (W), aluminum (Al), iron (Fe), cobalt (Co), zinc (Zn), tin (Sn), or nickel (Ni). As the conductive film which serves as an antenna, a film made of an alloy containing the above-described metal as a main component or a compound containing the above-described metal may be used instead of the film formed from the above-described metal. The conductive film which serves as an antenna can be formed of either a single layer of any of the above-described films or a plurality of stacked films thereof.

The conductive film which serves as an antenna can be formed by a CVD method, a sputtering method, a printing method such as screen printing or gravure printing, a droplet discharging method, a dispensing method, a plating method, a photolithography method, an evaporation method, or the like.

In the case of using a screen printing method, the conductive film which serves as an antenna can be formed by selectively printing a conductive paste in which conductive particles each having a particle size of several nm to several ten μm are dispersed in an organic resin onto the insulating film. The conductive particles can be formed from silver (Ag), gold (Au), copper (Cu), nickel (Ni), platinum (Pt), palladium (Pd), tantalum (Ta), molybdenum (Mo), tin (Sn), lead (Pb), zinc (Zn), chromium (Cr), titanium (Ti), or the like. Instead of such a metal, the conductive particles may be formed from an alloy containing the above-described metal as a main component or a compound containing the above-described metal. Alternatively, fine particles of silver halide or dispersible nanoparticles may be used. Further, as the organic resin contained in the conductive paste, polyimide, a siloxane-based resin, an epoxy resin, a silicone resin, or the like can be used.

As examples of an alloy of the above-described metals, the following combinations can be given: silver (Ag) and palladium (Pd), silver (Ag) and platinum (Pt), gold (Au) and platinum (Pt), gold (Au) and palladium (Pd), and silver (Ag) and copper (Cu). Alternatively, conductive particles of copper (Cu) coated with silver (Ag) can be used, for example.

It is to be noted that the conductive film which serves as an antenna is preferably formed as follows: a conductive paste is applied by a printing method or a droplet discharging method, and then baked. For example, in the case of using conductive particles (e.g., particle size of 1 nm or more and 100 nm or less) containing silver as a main component for the conductive paste, the conductive film which serves as an antenna can be formed by baking the conductive paste at temperatures of from 150° C. to 300° C. Baking may be performed either by lamp annealing with an infrared lamp, a xenon lamp, a halogen lamp, or the like, or by furnace annealing with an electric furnace. Alternatively, a laser annealing method with an excimer laser or an Nd:YAG laser may be used. Further alternatively, fine particles containing solder or lead-free solder as a main component may be used; in that case, it is preferable to use fine particles each having a particle size of 20 μm or less. Solder and lead-free solder have the advantage of low cost.

When a printing method or a droplet discharge method is used, the conductive film which serves as an antenna can be formed without using a mask for light-exposure. In addition, when a droplet discharge method or a printing method is used, waste of a material which would be removed by etching can be avoided unlike in a case of photolithography method. In addition, since an expensive mask for light exposure does not have to be used, the cost for manufacturing a semiconductor device can be reduced.

Figure 11A:
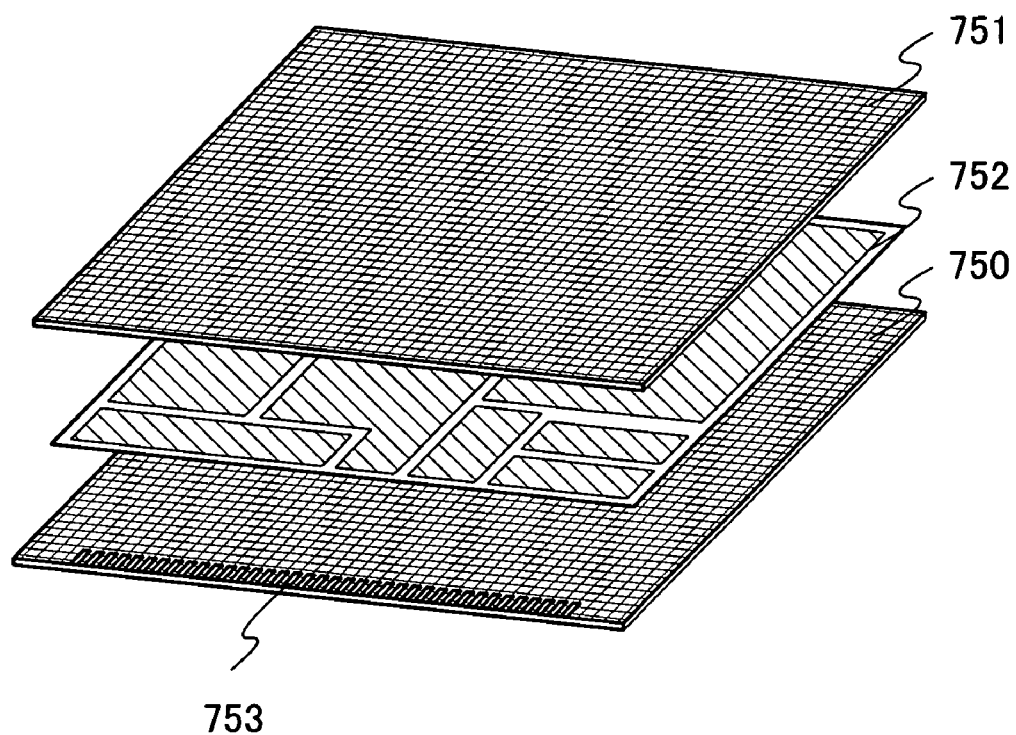
FIG. 11A illustrates a state where a pair of structure bodies and an element layer are aligned in a stacking order.
Figure 11B:
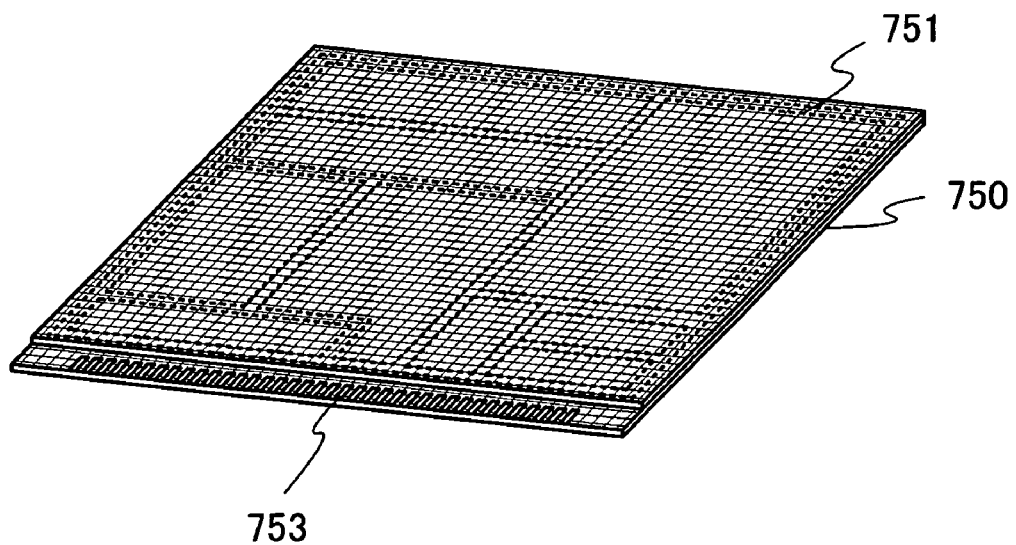
FIG. 11B is a perspective view of a semiconductor device.

Further, in the case where a semiconductor device has a terminal for electrical connection with an external device, the terminal may be provided over a structure body. FIG. 11A shows a state where a pair of structure bodies 750 and 751 and an element layer 752 provided between the pair of structure bodies are arranged in a stacking order. FIG. 11B shows a perspective view of a semiconductor device formed by stacking the pair of structure bodies 750 and 751 and the element layer 752.

The structure body 750 is provided with the terminal 753, and the element layer 752 and the structure body 750 are subjected to heating and pressure bonding, so that the terminal 753 and the element layer 752 are electrically connected to each other. The structure body 751 is stacked over the structure body 750 and the element layer 752 so as to overlap with the element layer 752 and expose the terminal 753.

Although this embodiment mode is described using a thin film transistor as an example, the present invention is not limited to this structure. As an alternative to a thin film transistor, a transistor or the like formed using an SOI can be used. Further alternatively, a transistor using an organic semiconductor or a transistor using a carbon nanotube may be used.

According to the present invention, a highly-reliable semiconductor device which is not easily damaged by external force, especially pressing force, can be manufactured.

This embodiment mode can be implemented by being combined with any of the above embodiment modes as appropriate.

Embodiment Mode 4

This embodiment mode describes a manufacturing method of a semiconductor device of the present invention, in which a semiconductor element is formed using a semiconductor film transferred from a semiconductor substrate (a bond substrate) to a supporting substrate (a base substrate) and the semiconductor element is transferred to a structure body.

Figure 12A:
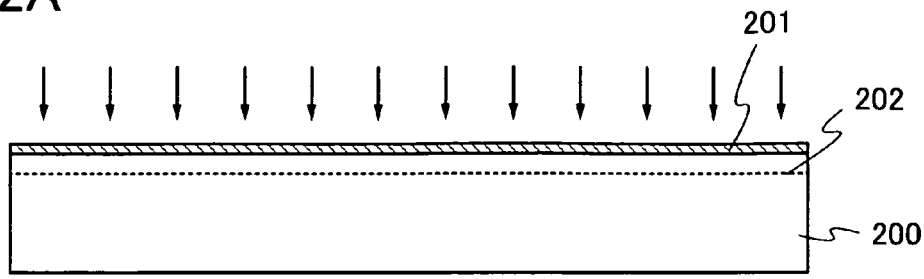
FIGS. 12A to 12D illustrate a manufacturing method of a semiconductor device of the present invention.

First, as shown in FIG. 12A, an insulating film 201 is formed over a bond substrate 200. The insulating film 201 is formed using an insulating material such as silicon oxide, silicon nitride oxide, or silicon nitride. The insulating film 201 may be either a single insulating film or stacked layers of a plurality of insulating films. For example, in this embodiment mode, the insulating film 201 is formed in which silicon oxynitride containing a larger amount of oxygen than nitrogen and silicon nitride oxide containing a larger amount of nitrogen than oxygen are stacked in this order from the side near the bond substrate 200.

For example, in the case of using silicon oxide for the insulating film 201, the insulating film 201 can be formed using a mixed gas of silane and oxygen, a mixed gas of TEOS (tetraethoxysilane) and oxygen, or the like by a vapor deposition method such as a thermal CVD method, a plasma CVD method, an atmospheric pressure CVD method, or a bias ECRCVD method. In this case, a surface of the insulating film 201 may be densified with oxygen plasma treatment. In the case of using silicon nitride for the insulating film 201, the insulating film 201 can be formed using a mixed gas of silane and ammonia by a vapor deposition method such as a plasma CVD method. In the case of using silicon nitride oxide for the insulating film 201, the insulating film 201 can be formed using a mixed gas of silane and ammonia or a mixed gas of silane and silicon oxide by a vapor deposition method such as a plasma CVD method.

Further, the insulating film 201 may be formed using silicon oxide which is formed using an organosilane gas by a chemical vapor deposition method. As the organosilane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

As shown in FIG. 12A, hydrogen or a rare gas, or hydrogen ions or rare gas ions is/are added to the bond substrate 200 as indicated by arrows, whereby a defect layer 202 having very small voids is formed in a region at a certain depth from a surface of the bond substrate 200. The position where the defect layer 202 is formed is determined depending on acceleration voltage at the time of the above-described addition. The thickness of a semiconductor film 208 which is transferred from the bond substrate 200 to the base substrate 204 is determined depending on the position of the defect layer 202;

therefore, acceleration of the voltage at the time of the addition is performed in consideration of the thickness of the semiconductor film 208. The semiconductor film 208 is formed to a thickness of from 10 nm to 200 nm, preferably from 10 nm to 50 nm. For example, in the case where hydrogen is added to the bond substrate 200, a dose is desirably from $1 \times 10^{16}/cm^2$ to $1 \times 10^{17}/cm^2$.

It is to be noted that, in some cases, in the above-described step of forming the defect layer 202, hydrogen or a rare gas, or hydrogen ions or rare gas ions is/are added to the bond substrate 200 at high concentration, and accordingly, a surface of the bond substrate 200 becomes rough and sufficient strength for bonding with the base substrate 204 cannot be obtained. The insulating film 201 is provided, whereby the surface of the bond substrate 200 is protected at the time of the addition of hydrogen or a rare gas, or hydrogen ions or rare gas ions, and the base substrate 204 and the bond substrate 200 can be favorably firmly bonded to each other.

Figure 12B:
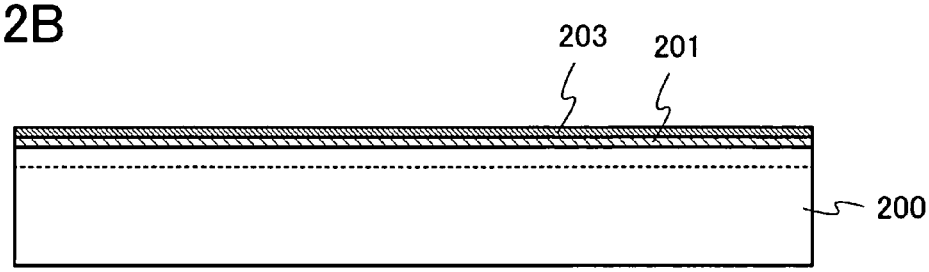

As shown in FIG. 12B, an insulating film 203 is formed over the insulating film 201. The insulating film 203 is formed using an insulating material such as silicon oxide, silicon nitride oxide, or silicon nitride in a manner similar to the insulating film 201. The insulating film 203 may be formed using a single insulating film or a stack of a plurality of insulating films. As the insulating film 203, silicon oxide may be formed using an organosilane gas by a chemical vapor deposition method. In this embodiment mode, silicon oxide formed using an organosilane gas by a chemical vapor deposition method is used for the insulating film 203.

An insulating film having an excellent barrier property such as silicon nitride or silicon nitride oxide is used for the insulating film 201 or the insulating film 203, whereby impurities such as an alkali metal or an alkaline-earth metal can be prevented from entering a semiconductor film 209, which is formed later, from the base substrate 204.

Although the insulating film 203 is formed after the defect layer 202 is formed in this embodiment mode, the insulating film 203 is not necessarily required. However, the insulating film 203 is formed after the defect layer 202 is formed; therefore, a surface of the insulating film 203 has planarity higher than that of the insulating film 201 which is formed before the defect layer 202 is formed. Accordingly, strength of bonding which is performed in a later step can be increased by the formation of the insulating film 203.

Figure 12C:
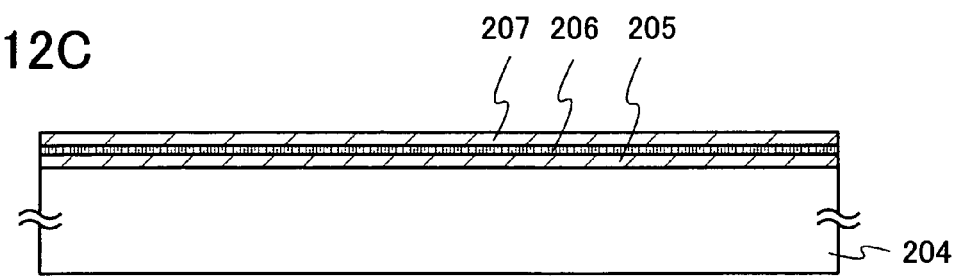

Meanwhile, as shown in FIG. 12C, an insulating film 205, a separation layer 206, and an insulating film 207 are sequentially formed over the base substrate 204.

The insulating films 205 and 207 are each formed using an insulating material such as silicon oxide, silicon nitride (e.g., $SiN_x$ or $Si_3N_4$), silicon oxynitride ($SiO_xN_y$, where x>y>0), or silicon nitride oxide ($SiN_xO_y$, where x>y>0) by a CVD method, a sputtering method, or the like.

The insulating films 205 and 207 are provided to prevent an alkali metal such as Na and an alkaline-earth metal which are contained in the base substrate 204 from diffusing into the semiconductor film 209, which is formed in a later step, and adversely affecting characteristics of semiconductor elements. In addition, the insulating film 207 can prevent an impurity element contained in the separation layer 206 from diffusing into the semiconductor elements, and can prevent the semiconductor elements and wirings from being cracked or damaged in a later step of separating the semiconductor elements.

Each of the insulating films 205 and 207 can be either a single insulating film or stacked layers of a plurality of insulating films. In this embodiment mode, the insulating film 207 is formed by sequentially stacking a silicon oxynitride film having a thickness of 100 nm, a silicon nitride oxide film having a thickness of 50 nm, and a silicon oxynitride film having a thickness of 100 nm. However, the material and the thickness of each film as well as the number of stacked films are not limited to those of this example. For example, the silicon oxynitride film in the lower layer may be replaced with a siloxane-based resin having a thickness of from 0.5 to 3 μm that is formed by a spin coating method, a slit coating method, a droplet discharge method, a printing method, or the like. In addition, the silicon nitride oxide film in the middle layer may be replaced with a silicon nitride film. Further, the silicon oxynitride film in the upper layer may be replaced with a silicon oxide film. A thickness of each film is preferably from 0.05 to 3 μm, and can be freely selected within this range.

Alternatively, it is also possible to form the lower layer of the insulating film 207, which is closest to the separation layer 206, using a silicon oxynitride film or a silicon oxide film, to form the middle layer thereof using a siloxane-based resin, and to form the top layer thereof using a silicon oxide film.

It is to be noted that a siloxane-based resin is a resin formed from a siloxane-based material as a starting material and having the bond of Si—O—Si. A siloxane-based resin may contain at least one kind of fluorine, an alkyl group, and aromatic hydrocarbon, in addition to hydrogen as a substituent.

The silicon oxide film can be formed using a mixed gas such as $SiH_4/O_2$, TEOS (tetraethoxysilane)/$O_2$, or the like by a thermal CVD method, a plasma CVD method, an atmospheric pressure CVD method, a bias ECRCVD method, or the like. The silicon nitride film can be typically formed using a mixed gas of $SiH_4$ and $NH_3$ by a plasma CVD method. The silicon oxynitride film and the silicon nitride oxide film can be typically formed using a mixed gas of $SiH_4$ and $N_2O$ by a plasma CVD method.

For the separation layer 206, it is possible to use a metal film, a metal oxide film, or a stacked film of a metal film and a metal oxide film. The metal film and the metal oxide film may each have either a single layer or a stacked structure of a plurality of layers. As an alternative to a metal film or a metal oxide film, metal nitride or metal oxynitride may alternatively be used. The separation layer 206 can be formed by a sputtering method or various CVD methods such as a plasma CVD method.

Examples of metals used for the separation layer 206 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and the like. The separation layer 206 may alternatively be formed using a film made of an alloy containing any of the above-described metals as a main component or a film made of a compound containing any of the above-described metals, as an alternative to a film formed from the above-described metals.

Alternatively, the separation layer 206 may be formed using a single silicon (Si) film or a film made of a compound containing silicon (Si) as a main component. Further alternatively, the separation layer 206 may be formed using a film made of an alloy of silicon (Si) and any of the above-described metals. A film containing silicon can have any of amorphous, microcrystalline, and polycrystalline structures.

The separation layer 206 can be either a single layer of any of the above-described films or stacked layers thereof. The separation layer 206 having a stack of a metal film and a metal oxide film can be formed by sequentially forming a base metal film and oxidizing or nitriding the surface of the metal film. Specifically, plasma treatment may be performed on the base metal film in an oxygen atmosphere or an $N_2O$ atmosphere, or heat treatment may be performed on the metal film in an oxygen atmosphere or an $N_2O$ atmosphere. Alternatively, oxidation of the metal film can be performed by forming a silicon oxide film or a silicon oxynitride film on the base metal film so as to be in contact with the base metal film. Similarly, nitridation can be performed by forming a silicon nitride oxide film or a silicon nitride film on the base metal film so as to be in contact with the base metal film.

As the plasma treatment for oxidation or nitridation of the metal film, it is possible to perform high-density plasma treatment with a plasma density of $1 \times 10^{11}$ cm$^{-3}$ or higher, preferably from $1 \times 10^{11}$ to $9 \times 10^{15}$ cm$^{-3}$, and with high frequency such as microwaves (e.g., a frequency of 2.45 GHz).

Although the separation layer 206 having a stack of a metal film and a metal oxide film can be formed by oxidizing the surface of the base metal film, it is also possible to sequentially form a metal film and a metal oxide film thereover. For example, in the case of using tungsten as a metal, a tungsten film is formed as a base metal film by a sputtering method, a CVD method, or the like, and then, plasma treatment is performed on the tungsten film. Accordingly, a tungsten film that is a metal film and a metal oxide film that is in contact with the metal film and is formed from oxide of tungsten can be formed.

It is to be noted that oxide of tungsten is represented by $WO_X$. X is in the range of 2 to 3, inclusive. There are cases where X is 2 ($WO_2$), X is 2.5 ($W_2O_5$), X is 2.75 ($W_4O_{11}$), and X is 3 ($WO_3$). In formation of oxide of tungsten, there is no particular limitation on the value of X, and the value of X may be determined based on the etching rate or the like.

Before the bond substrate 200 and the base substrate 204 are bonded together, the bond substrate 200 may be hydrogenated. The hydrogenation is performed for example, at 350° C. in a hydrogen atmosphere for approximately two hours.

Figure 12D:
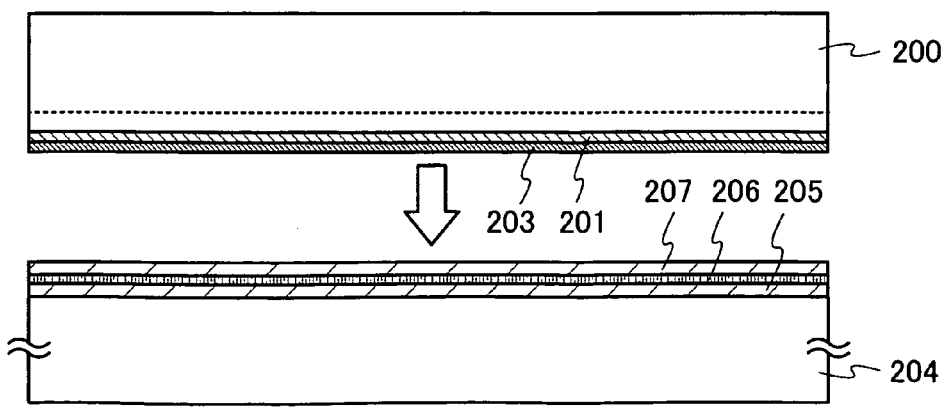

As shown in FIG. 12D, the bond substrate 200 is bonded to the base substrate 204 so that the insulating films 203 and 207 are interposed therebetween. The insulating film 203 and the insulating film 207 are bonded to each other, whereby the bond substrate 200 and the base substrate 204 can be bonded together.

The bond substrate 200 and the base substrate 204 are bonded to each other by van der Waals forces, so that they are firmly attached to each other even at room temperature. It is to be noted that since the above-described attachment can be performed at a low temperature, various substrates can be used as the base substrate 204. As the base substrate 204, for example, a glass substrate made of aluminosilicate glass, barium borosilicate glass, aluminoborosilicate glass, or the like; a substrate such as a. quartz substrate or a sapphire substrate; or the like can be used. Furthermore, as the base substrate 204, a semiconductor substrate formed from silicon, gallium arsenide, indium phosphide, or the like can be used. Alternatively, a metal substrate including a stainless steel substrate may be used as the base substrate 204. A substrate formed from a synthetic resin which has flexibility, such as plastic, generally tends to have lower allowable temperature limit than the above substrates; however, the substrate can be used as the base substrate 204 as long as it can resist a processing temperature in a manufacturing process. As a plastic substrate, polyester typified by polyethylene terephthalate (PET); polyether sulfone (PES); polyethylene naphthalate (PEN); polycarbonate (PC); polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; or the like can be used.

As the bond substrate 200, a single crystal semiconductor substrate of silicon, germanium, or the like or a polycrystalline semiconductor substrate of silicon, germanium, or the like can be used. Alternatively, a single crystal semiconductor substrate or a polycrystalline semiconductor substrate formed from a compound semiconductor of gallium arsenide, indium phosphide, or the like can be used as the bond substrate 200. Alternatively, as the bond substrate 200, a semiconductor substrate formed from silicon having lattice distortion, silicon germanium in which germanium is added to silicon, or the like may also be used. Silicon having lattice distortion can be formed by being formed on silicon germanium or silicon nitride, which has a larger lattice constant than silicon.

It is to be noted that heat treatment or pressure treatment may be performed after the base substrate 204 and the bond substrate 200 are bonded to each other. The bond strength can be increased with heat treatment or pressure treatment.

Figure 13A:
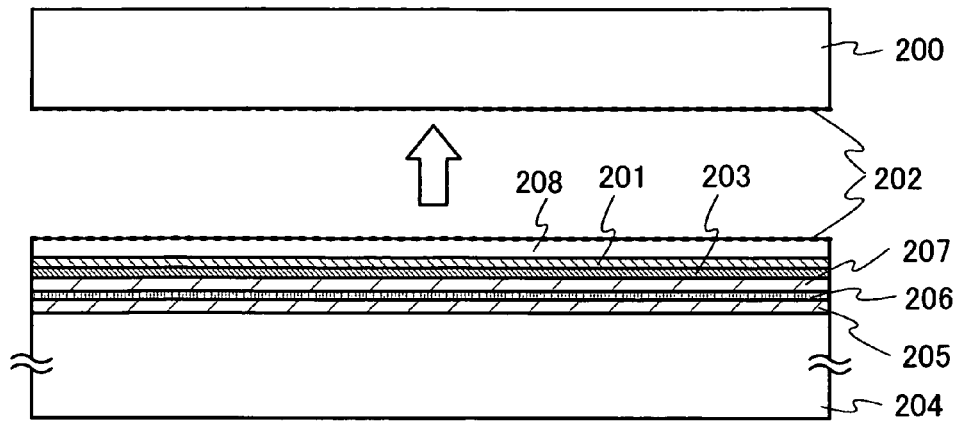
FIGS. 13A to 13C illustrate a manufacturing method of a semiconductor device of the present invention.

Heat treatment is performed after the insulating film 203 and the insulating film 207 are bonded to each other between the bond substrate 200 and the base substrate 204, whereby the adjacent microvoids in the defect layer 202 are coupled, and the volume of the microvoids is increased. As a result, as shown in FIG. 13A, the bond substrate 200 is split along the defect layer 202; thus, the semiconductor film 208 which had been part of the bond substrate 200 is separated from the bond substrate 200. The heat treatment is preferably performed at a temperature that is equal to or lower than the allowable temperature limit of the base substrate 204. For example, the heat treatment may be performed at a temperature ranging from 400° C. to 600° C. After the separation, together with the insulating film 201 and the insulating film 203, the semiconductor film 208 is transferred to the base substrate 204. After that, heat treatment at a temperature from 400° C. to 600° C. is preferably performed in order to make stronger the bonding between the insulating film 203 and the insulating film 207.

Crystal plane orientation of the semiconductor film 208 can be controlled with the plane orientation of the bond substrate 200. The bond substrate 200 having crystal plane orientation which is suitable for a semiconductor element which is to be formed may be selected as appropriate. The mobility of the transistor depends on the crystal plane orientation of the semiconductor film 208. In order to obtain a transistor with higher mobility, the direction of bonding of the bond substrate 200 is set in consideration of the direction of a channel and the crystal plane orientation.

Next, a surface of the transferred semiconductor film 208 is planarized. Although the planarization is not necessarily essential, the planarization makes it possible to improve characteristics of the interface between the semiconductor film 208 and a gate insulating film in the transistor which is to be formed later. Specifically, the planarization can be performed by chemical mechanical polishing (CMP), liquid jet polishing, or the like. The thickness of the semiconductor film 208 is reduced by the above-described planarization.

It is to be noted that, although this embodiment mode describes the case where a Smart Cut (registered trademark) method is used in which the semiconductor film 208 is separated from the bond substrate 200 by the formation of the defect layer 202, the semiconductor film 208 may be bonded to the base substrate 204 by any other bonding method such as ELTRAN (epitaxial layer transfer), a dielectric isolation method, or a PACE (plasma assisted chemical etching) method.

Figure 13B:
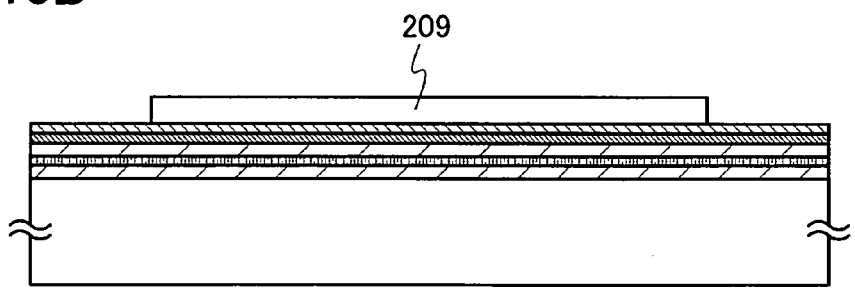

Next, as shown in FIG. 13B, the semiconductor film 208 is processed (patterned) to have a predetermined shape, whereby an island-shaped semiconductor film 209 is formed.

Figure 13C:
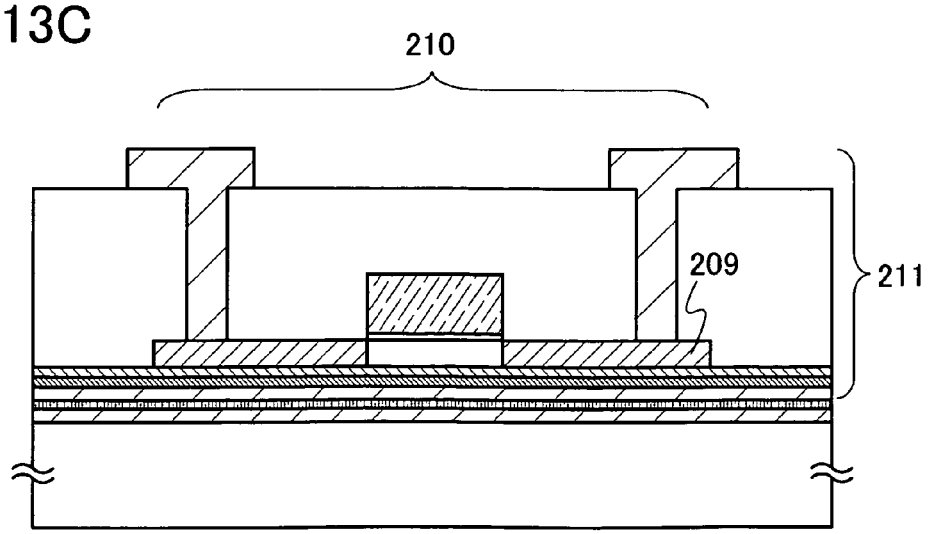

The present invention makes it possible to form various semiconductor elements such as transistors with the use of the semiconductor film 209 which is formed through the above-described steps. A transistor 210 formed using the semiconductor film 209 is shown in FIG. 13C as an example.

Figure 14A:
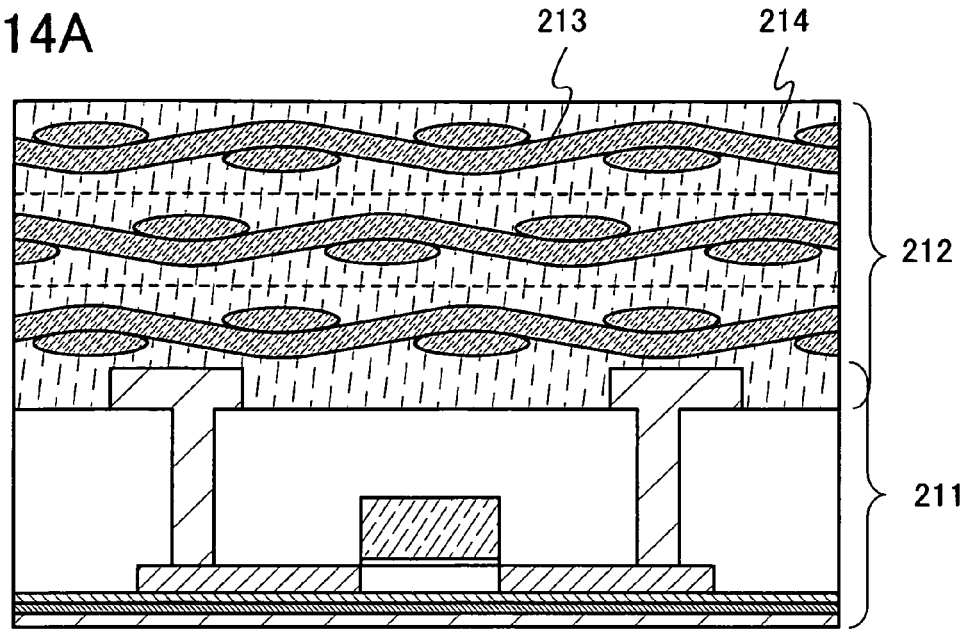
FIGS. 14A and 14B illustrate a manufacturing method of a semiconductor device of the present invention.

Subsequently, as shown in FIG. 14A, an element layer 211 including an integrated circuit formed using the transistor 210, a wiring, and the like, and a structure body 212 are subjected to heating and pressure bonding. Then, the element layer 211 and the structure body 212 are separated from the base substrate 204.

As the structure body 212, an object is used including a stack of a plurality of structure bodies in each of which a fibrous body 213 is impregnated with an organic resin 214. Such a structure body 212 is also referred to as a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured. A thickness of the structure body 212 is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured.

In this embodiment mode, a plurality of structure bodies in each of which a fibrous body of a single layer is impregnated with an organic resin is stacked to form the structure body 212. However, the present invention is not limited to this structure. A structure body may be used in which a stack of a plurality of fibrous bodies is impregnated with an organic resin. In stacking a plurality of structure bodies in each of which a fibrous body of a single layer is impregnated with an organic resin, another layer may be interposed between the structure bodies.

In the structure body 212, the organic resin 214 is plasticized or cured by heating and pressure bonding. In the case where the organic resin 214 is an organic plastic resin, the organic resin which is plasticized is then cured by cooling the organic resin to room temperature. By heating and pressure bonding, the organic resin 214 is uniformly spread so as to be in close contact with the element layer 211, and is cured. A step in which the structure body 212 is subjected to pressure bonding is performed under an atmospheric pressure or a reduced pressure.

The separation occurs in the separation layer 206. The separation can be performed by using physical force, for example, by pulling by a human hand or a gripping tool, or separating while rolling a roller. The separation layer 206 may partially remain without being entirely removed.

Although this embodiment mode uses a method in which a metal oxide film is used for the separation layer and the element layer 211 is separated using physical means, a separation method used for the present invention is not limited thereto. For example, a method may be used in which a light-transmitting base substrate 204 is used, amorphous silicon including hydrogen is used for the separation layer 206, the separation layer 206 is irradiated with a laser beam from the base substrate 204 side to vaporize hydrogen included in the amorphous silicon, so that the base substrate 204 is separated from the element layer 211.

The above-described separation may be performed by a method of etching the separation layer 206. In this case, a trench is formed so as to partly expose the separation layer 206. The trench is formed by dicing, scribing, and a process using a laser beam including UV light, a photolithography method, or the like. The trench may be deep enough to expose the separation layer 206. Further, halogen fluoride is used as an etching gas, and the gas is introduced through the trench. In this embodiment mode, etching is performed under the conditions of, for example, using $ClF_3$ (chlorine trifluoride), a temperature of 350° C., a flow rate of 300 sccm, an atmospheric pressure of 800 Pa, and a period of three hours. Alternatively, nitrogen may be mixed into the $ClF_3$ gas. Using halogen fluoride such as $ClF_3$ enables the separation layer 206 to be selectively etched, so that the base substrate 204 can be separated from the element layer 211. It is to be noted that halogen fluoride may be either gas or liquid.

Alternatively, by a method of removing the base substrate 204 by mechanical polishing or a method of removing the base substrate 204 by dissolution of the substrate with a solution such as HF, the element layer 211 can be separated from the base substrate 204. In this case, the separation layer 206 is not necessary.

Figure 14B:
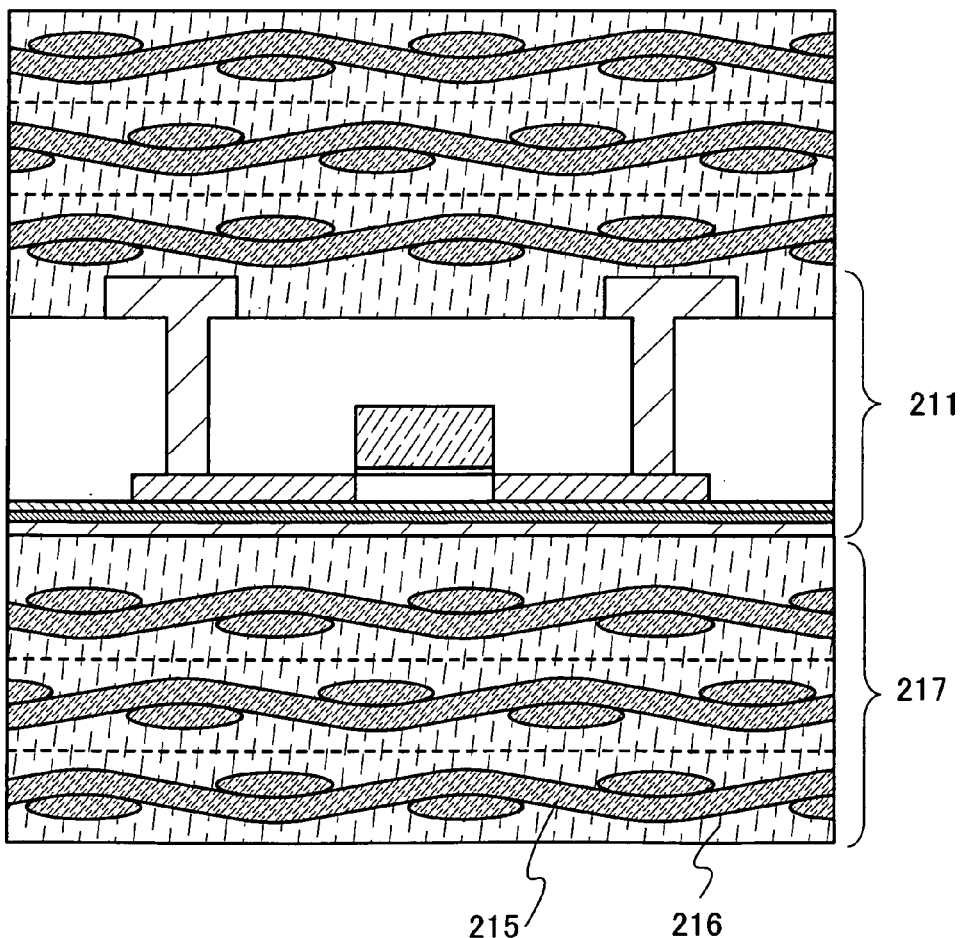

As shown in FIG. 14B, a structure body 217 including a stack of a plurality of structure bodies in each of which a fibrous body 215 is impregnated with an organic resin 216 is superposed on the side of the element layer 211 which is exposed by the above-described separation. The thickness of the structure body 217 is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured.

In this embodiment mode, a plurality of structure bodies in each of which a fibrous body of a single layer is impregnated with an organic resin is stacked to form the structure body 217. However, the present invention is not limited to this structure. A structure body may be used in which a stack of a plurality of fibrous bodies is impregnated with an organic resin. In stacking a plurality of structure bodies in each of which a fibrous body of a single layer is impregnated with an organic resin, another layer may be interposed between the structure bodies.

The structure body 217 is heated and subjected to pressure bonding so that the organic resin 216 of the structure body 217 is plasticized or cured. In the case where the organic resin 216 is an organic plastic resin, the organic resin which is plasticized is then cured by cooling the organic resin to room temperature. By heating and pressure bonding, the organic resin 216 is uniformly spread so as to be in close contact with the element layer 211, and is cured. A step in which the structure body 217 is subjected to pressure bonding is performed under an atmospheric pressure or a reduced pressure.

In the case where semiconductor elements corresponding to a plurality of semiconductor devices are formed between the structure body 212 and the structure body 217, the element layer 211 is divided for each semiconductor device. The division can be performed using a laser irradiation apparatus, a dicing apparatus, a scribing apparatus, a cutting machine having an edged tool such as scissors or a knife, or the like. In the case of using a laser irradiation apparatus, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaALAs, or InGaAsP laser. It is to be noted that a fundamental wave to a fifth harmonic are preferably used in a solid-state laser as appropriate.

Through the above-described process, the semiconductor device of the present invention is manufactured.

According to the present invention, a highly-reliable semiconductor device which is not easily damaged by external force, especially pressing force, can be manufactured.

This embodiment mode can be implemented by being combined with any of the above embodiment modes as appropriate.

Embodiment Mode 5

This embodiment mode describes an example in which a plurality of fibrous bodies are stacked so as to overlap with an element layer and the plurality of fibrous bodies are impregnated with an organic resin so that a structure body which is fixed to the element layer is formed.

Figure 15A:
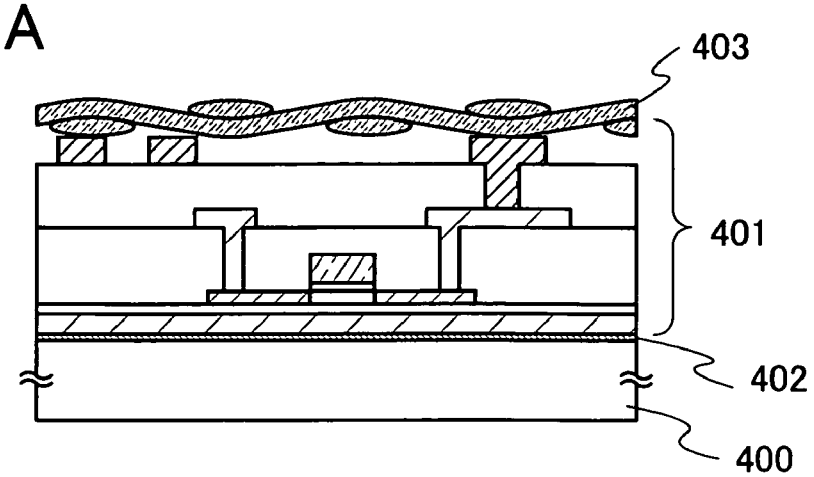
FIGS. 15A to 15C illustrate a manufacturing method of a semiconductor device of the present invention.

First, as shown in FIG. 15A, an element layer 401 is formed over a substrate 400. In FIG. 15A, a separation layer 402 is formed to facilitate separation of the element layer 401 from the substrate 400 later; however, the present invention is not limited to this structure. The separation layer 402 is not necessarily provided or a needed layer may be added as appropriate, depending on a separation method.

A fibrous body 403 is stacked over the element layer 401 so as to overlap with the element layer 401. The fibrous body 403 is a woven fabric or a nonwoven fabric which uses high-strength fibers of an organic compound or an inorganic compound, and the fibrous body 403 overlaps with the entire surface of the element layer 401. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As the glass fiber, a glass fiber using E glass, S glass, D glass, Q glass, and the like can be given. It is to be noted that the fibrous body 403 may be formed from one kind of the above-described high-strength fibers or a plurality of the above-described high-strength fibers.

The fibrous body 403 may be formed using a woven fabric which is woven using bundles of fibers (single yarn) (hereinafter, the bundles of fibers is referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Use of a yarn bundle having an elliptical shape or a flat shape in its cross section as described above can make the fibrous body 403 thin. Accordingly, a thin semiconductor device can be manufactured. An effect of the present invention is achieved when the diameter of the yarn bundle is greater than or equal to 4 μm and less than or equal to 400 μm, furthermore greater than or equal to 4 μm and less than or equal to 200 μm. Theoretically, the diameter of the yarn bundle may be even smaller than that. Further, an effect of the present invention is achieved when the thickness of the fiber is greater than or equal to 4 μm and less than or equal to 20 μm. Theoretically, the thickness of the fiber may be even smaller than that, and the thickness of the fiber depends on a material of the fiber.

Figure 15B:
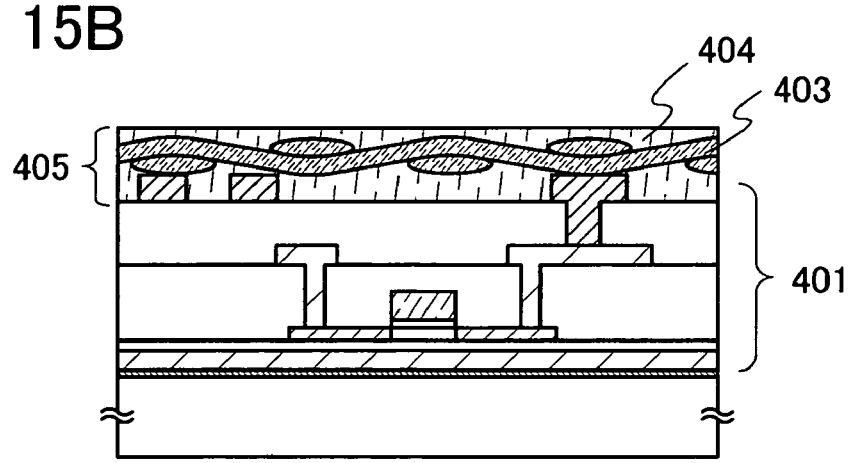

As shown in FIG. 15B, the fibrous body 403 is impregnated with an organic resin 404. The organic resin 404 is plasticized or cured by heating, whereby a structure body 405 fixed to the element layer 401 is formed. In the case where the organic resin is an organic plastic resin, the organic resin which is plasticized is then cured by cooling the organic resin to room temperature.

A thermosetting resin such as an epoxy resin, an unsaturated polyester resin, a polyimide resin, a bismaleimide-triazine resin, or a cyanate resin can be used for the organic resin 404. Alternatively, a thermoplastic resin such as a polyphenylene oxide resin, a polyetherimide resin, or a fluorine resin can be used. Further alternatively, a plurality of resins selected from the above-described thermosetting resin and thermoplastic resin may be used. When the above-described organic resin is used, the fibrous body can be fixed to the element layer 103 by heat treatment. The higher the glass transition temperature of the organic resin 404 is, the less the organic resin 404 and the organic resin 105 are destroyed by local pressing force, which is preferable.

As a method of impregnation with the organic resin 404, a printing method, a cast method, a droplet discharge method, a dip coating method, or the like can be used.

Highly thermally-conductive filler may be dispersed in the organic resin 404 or the yarn bundle of the fibrous body 403. As the highly thermally-conductive filler, aluminum nitride, boron nitride, silicon nitride, alumina, or the like can be given. As the highly thermally-conductive filler, metal particles of silver, copper, or the like can also be given. When the highly thermally-conductive filler is included in the organic resin or the yarn bundle of fibers, heat generated in the element layer can be easily released to the outside. Accordingly, thermal storage in the semiconductor device can be suppressed, and a defect of the semiconductor device can be reduced.

Figure 15C:
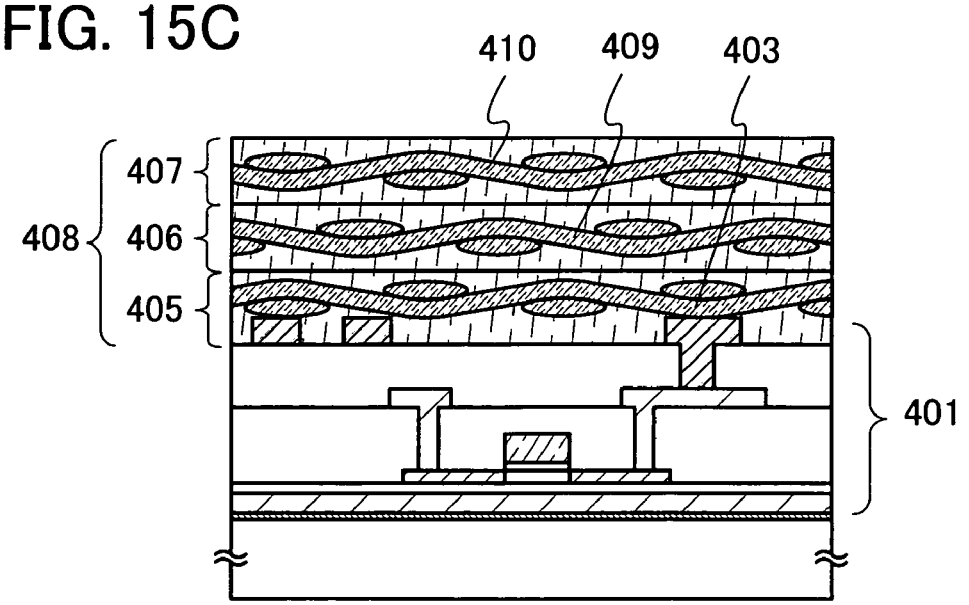

The above-described process is repeated, whereby a structure body 406 including a fibrous body 409 and a structure body 407 including a fibrous body 410 are sequentially formed so as to be stacked over the structure body 405 as shown in FIG. 15C. The structure bodies 405 to 407 can form a structure body 408 in which a plurality of fibrous bodies 403, 409, and 410 are stacked.

The structure body 408 includes the three structure bodies 405 to 407 in this embodiment mode; however, the present invention is not limited to this structure. The structure body 408 may include two structure bodies or four or more structure bodies. In addition, the structure bodies 405 to 407 are directly fixed to each other in this embodiment mode; however, another layer may be provided between the structure bodies 405 to 407.

Figure 16A:
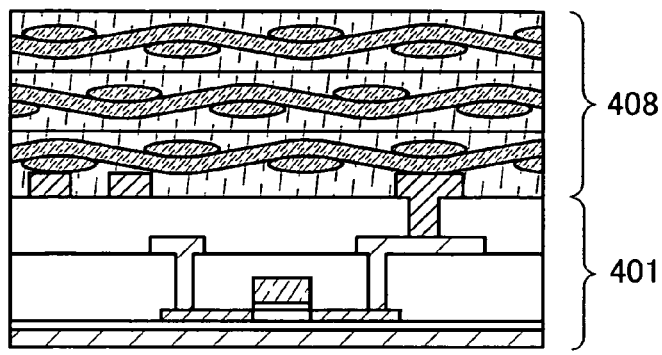
FIGS. 16A to 16C illustrate a manufacturing method of a semiconductor device of the present invention.

As shown in FIG. 16A, the substrate 400 is separated from the element layer 401. The separation can be performed within the separation layer 402. As a method for separating the element layer 401, any of the following methods and the like as described in Embodiment Mode 3 or Embodiment Mode 4 can be used: a method for separating the element layer 401 and the substrate 400 in a separation layer by using physical force; a method in which amorphous silicon including hydrogen is used for the separation layer 402 and the separation layer 402 is irradiated with a laser beam from the substrate 400 side to vaporize hydrogen included in the amorphous silicon, so that the substrate 400 is separated from the element layer 401; a method for etching the separation layer 402; a method of removing the substrate 400 by mechanical polishing; a method for removing the substrate 400 by dissolution of the substrate 400 with a solution such as HF.

Figure 16B:
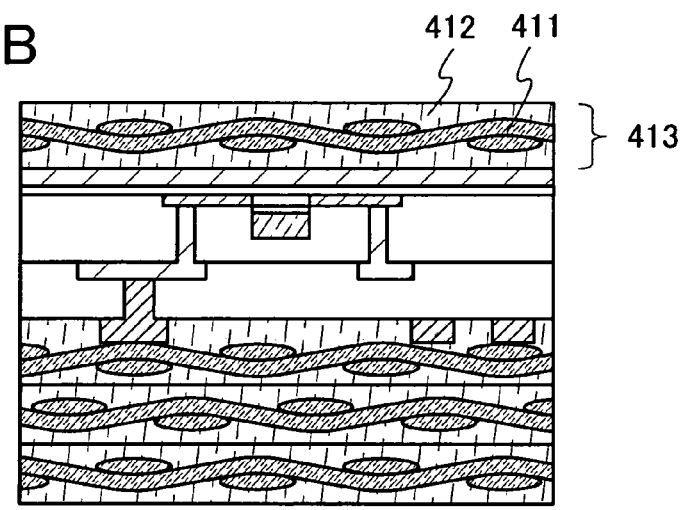

As shown in FIG. 16B, after the fibrous body 411 is superposed so as to overlap with the side of the substrate 400 which is exposed by the separation, the fibrous body 411 is impregnated with an organic resin 412. The organic resin 412 is plasticized or cured by heating, whereby a structure body 413 fixed to the element layer 401 is formed. The structure body 413 overlaps with the structure body 408 with the element layer 401 interposed therebetween. In the case where the organic resin is an organic plastic resin, the organic resin which is plasticized is then cured by cooling the resin to room temperature.

Figure 16C:
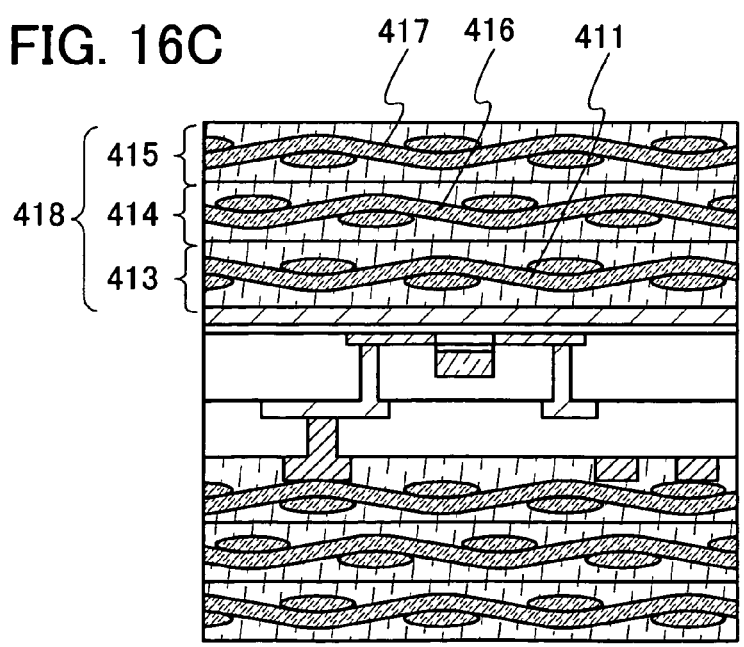

The above-described process is repeated, whereby a structure body 414 including a fibrous body 416 and a structure body 415 including a fibrous body 417 are sequentially formed so as to be stacked over the structure body 413 as shown in FIG. 16C. The structure bodies 413 to 415 can form a structure body 418 in which a plurality of fibrous bodies 411, 416, and 417 are stacked.

The structure body 418 includes three structure bodies 413 to 415 in this embodiment mode; however, the present invention is not limited to this structure. The structure body 418 may include two structure bodies or four or more structure bodies. In addition, the structure bodies 413 to 415 are directly fixed to each other in this embodiment mode; however, another layer may be provided between the structure bodies 413 to 415.

Further, in this embodiment mode, a structure body including a stack of a plurality of fibrous bodies is formed in such a way that the process in which a fibrous body is superposed and then impregnated with an organic resin is repeated multiple times. However, the present invention is not limited to this structure. A structure body including a stack of a plurality of fibrous bodies can be formed in such a way that after a stack of a plurality of fibrous bodies is superposed on an element layer, the plurality of fibrous bodies are impregnated with an organic resin.

It is to be noted that the structure body 408 and the structure body 418 are set to have almost the same thickness. Accordingly, when a semiconductor device is bent by application of stress, pressure can be prevented from being locally applied to the element layer 401 provided between the structure body 408 and the structure body 418. Thus, reliability of the semiconductor device can be increased.

According to the present invention, a highly-reliable semiconductor device which is not easily damaged by external force, especially pressing force, can be manufactured.

This embodiment mode can be implemented by being combined with any of the above embodiment modes as appropriate.

Embodiment Mode 6

This embodiment mode describes a structure of a card-like RF tag which is also called an IC card.

Figure 17A:
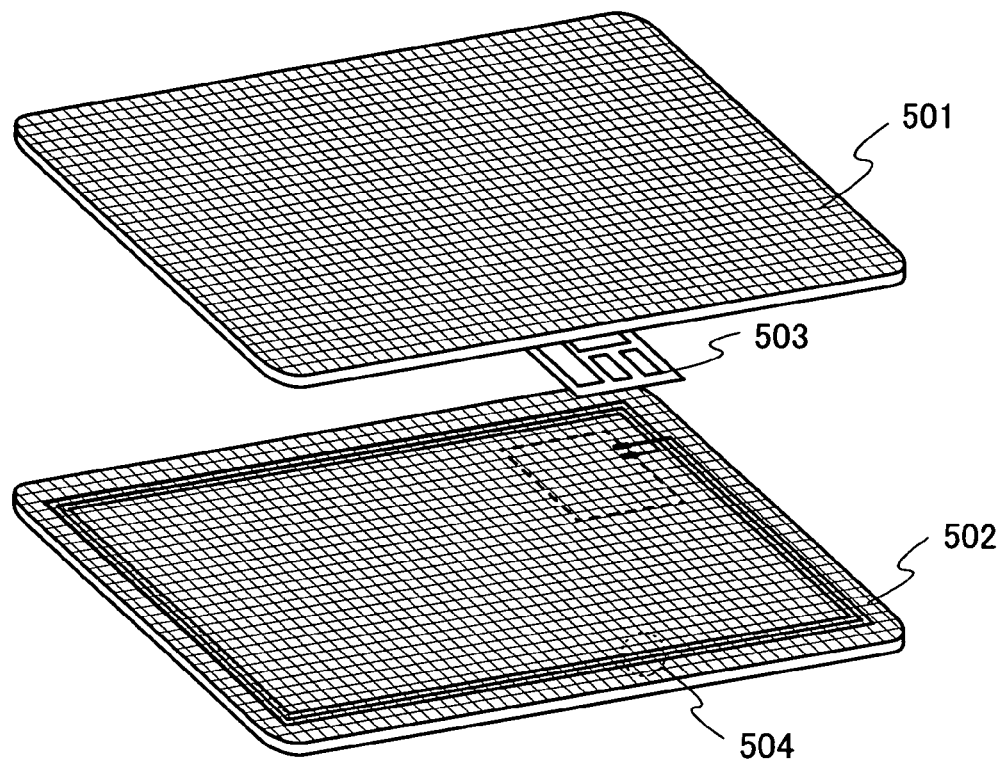
FIGS. 17A and 17B illustrate a structure of an RF tag of the present invention.
Figure 17B:
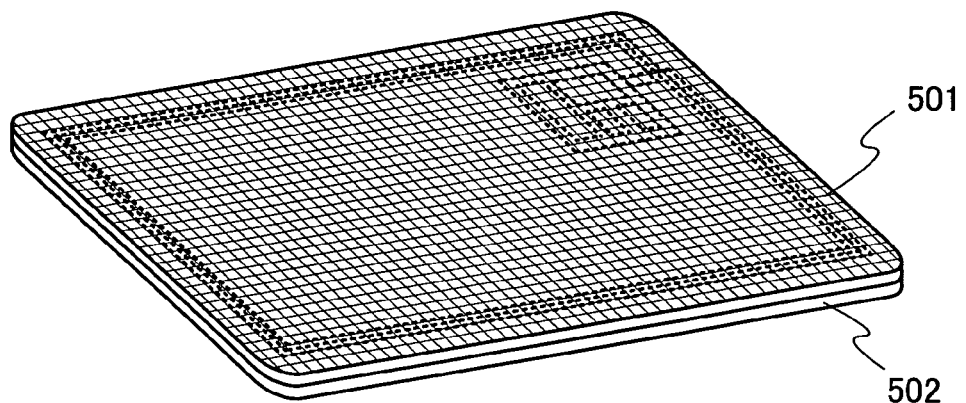

FIG. 17A shows the state where a pair of structure bodies 501 and 502 and an element layer 503 provided between the structure bodies 501 and 502 are aligned in a stacking order. FIG. 17B shows a perspective view of an RF tag formed by stacking the pair of structure bodies 501 and 502 and the element layer 503.

Each of the structure bodies 501 and 502 has a stack of a plurality of fibrous bodies. An antenna 504 is formed over the structure body 502. Owing to the element layer 503 being stacked over the structure body 502, the element layer 503 and the antenna 504 are electrically connected to each other.

Further, the structure body 501 and the structure body 502 are superposed on each other so as to interpose the element layer 503 and the antenna 504 therebetween.

It is to be noted that the structure body 501 and the structure body 502 are set to have almost the same thickness. Accordingly, when a semiconductor device is bent by application of stress, pressure can be prevented from being locally applied to the element layer 503 provided between the structure body 501 and the structure body 502. Thus, reliability of the semiconductor device can be increased.

FIGS. 17A and 17B illustrate the case where the antenna 504 has a coil-like shape; however, the shape of an antenna used in the present invention is not limited to this. The antenna 504 may have any shape as long as the antenna 504 can receive signals wirelessly. For example, a dipole antenna, a patch antenna, a loop antenna, a Yagi antenna, or the like can be used. The shape of the antenna may be selected as appropriate in accordance with a wavelength of carriers or a transmission method.

Figure 18:
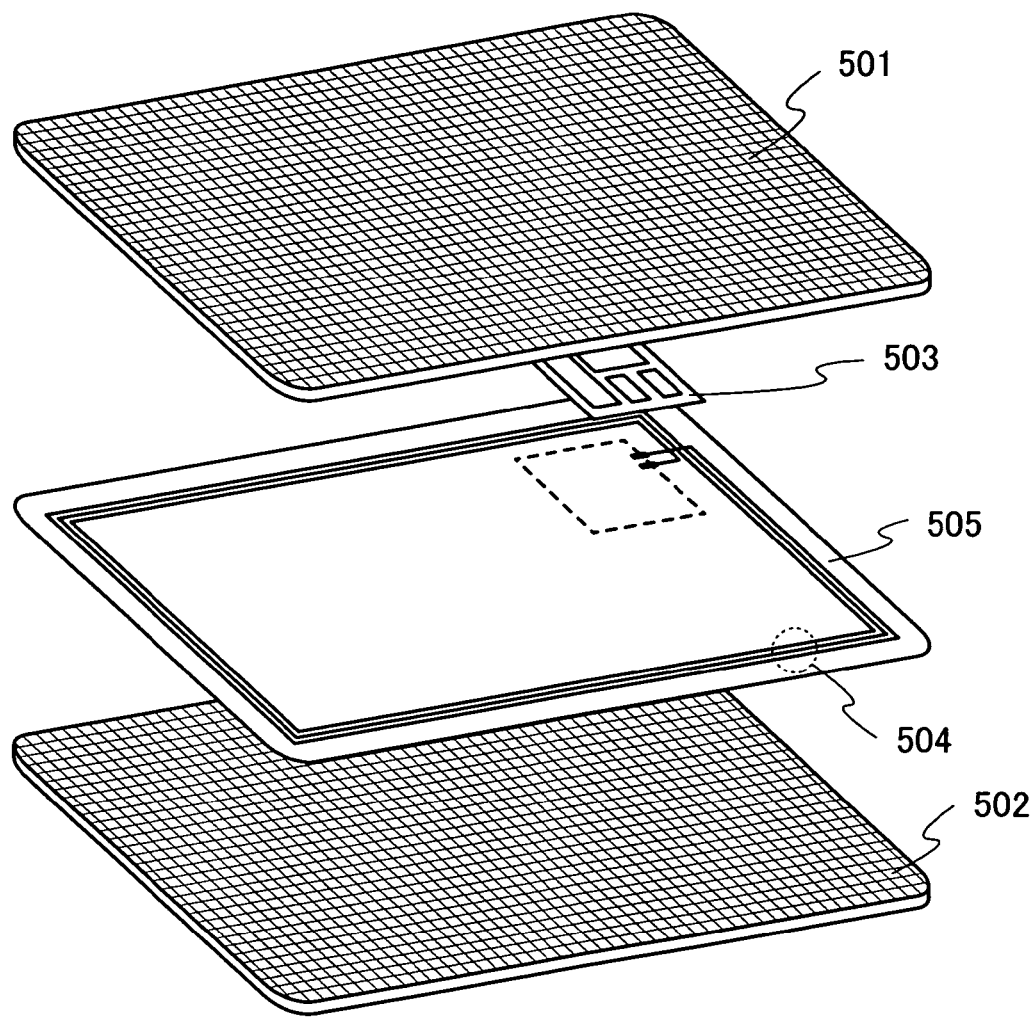
FIG. 18 illustrates a structure of an RF tag of the present invention.

Further, although FIGS. 17A and 17B show an example in which the antenna 504 is formed over the structure body 502, the antenna 504 may be formed over a different substrate from the structure body 501 and the structure body 502. FIG. 18 shows the state where the pair of structure bodies 501 and 502, the element layer 503 provided between the structure bodies 501 and 502, and a substrate 505 serving as an inlay sheet which is provided with the antenna 504 are aligned in a stacking order.

In FIG. 18, owing to the element layer 503 being stacked over the substrate 505, the element layer 503 and the antenna 504 are electrically connected to each other. Further, the structure body 501 and the structure body 502 are superposed on each other so as to interpose the element layer 503 and the substrate 505 therebetween.

According to the present invention, a highly-reliable semiconductor device which is not easily damaged by external force, especially pressing force, can be manufactured.

This embodiment mode can be implemented by being combined with any of the above embodiment modes as appropriate.

Embodiment Mode 7

This embodiment mode describes an example of the shape of a structure body.

An RF tag, which is one of semiconductor devices of the present invention, has been put into practical use in various fields, and has been anticipated to further expand the market as a new mode of a communication information terminal. Therefore, an RF tag is expected to work well in various environments. Thus, it is desirable that a structure body included in the RF tag be not susceptible to damage such as a crack or a chip even when external force is applied. In this embodiment mode, a structure body is formed into a shape in which each corner is rounded, so that damage such as a crack or a chip can be prevented in the structure body. Further, in this embodiment mode, the structure body is formed into a polygon in which all exterior angles are less than or equal to 60°, so that damage such as a crack or a chip can be prevented in the structure body.

Figure 19A:
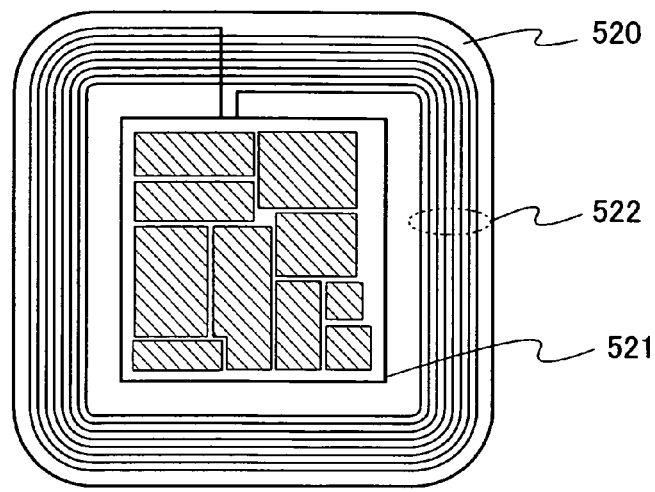
FIGS. 19A to 19C are top views of structure bodies included in semiconductor devices of the present invention.

FIG. 19A is a top view of an RF tag which is one of semiconductor devices of the present invention. The RF tag shown in FIG. 19A includes a structure body 520, an element layer 521 including an integrated circuit, and an antenna 522. The element layer 521 and the antenna 522 are disposed over the structure body 520. It is to be noted that, although FIG. 19A shows only one structure body 520 to clarify the structure of an RF tag, an RF tag of the present invention has a pair of structure bodies. Therefore, actually, another structure body is provided so that the element layer 521 and the antenna 522 are interposed between the structure body and the structure body 520.

The structure body 520 has a rectangular shape with rounded four corners. The shape of the structure body 520 is described in detail with reference to FIG. 19B. When the shape of the structure body 520 is assumed to be a rectangle, the distance between facing two sides of the rectangle which are indicated by dashed lines is denoted by L. It is to be noted that the shortest distance is employed as L. Further, a radius of curvature in each corner of the structure body 520 is denoted by R. In this embodiment mode, when R is set to L/5 to L/50, damage such as a crack or a chip can be prevented in the structure body 520.

Figure 19B:
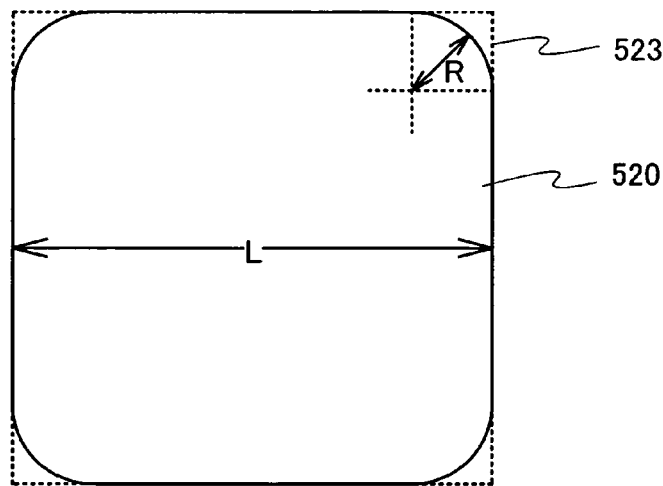
Figure 19C:
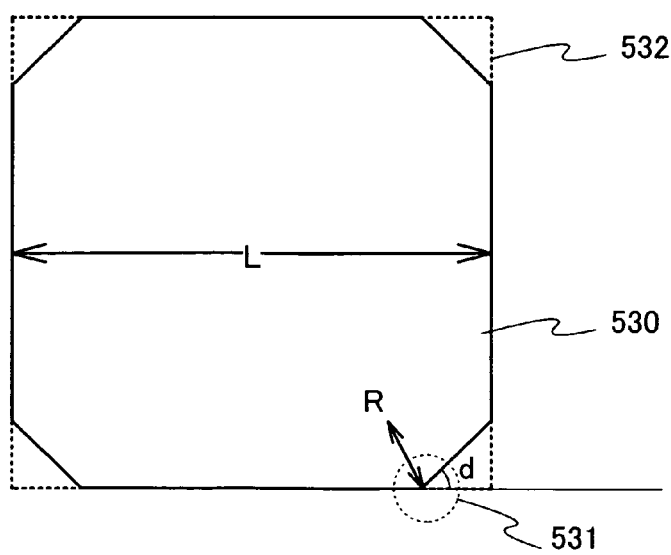

FIG. 19C shows the shape of a structure body included in an RF tag of the present invention, which is different from FIG. 19B. A structure body 530 shown in FIG. 19C has a rectangular shape in which triangles are cut from the four corners. The exterior angle of each corner 531 included in the structure body 530 is set to be greater than or equal to 35° and less than or equal to 55°, so that damage such as a crack or a chip can be prevented in the structure body 530 when external force is applied.

Further, each corner of the structure body 530 shown in FIG. 19C may be rounded. In this case, when the shape of the structure body 530 is assumed to be a rectangle, the distance between facing two sides of the rectangle which are indicated by dashed lines 532 is denoted by L. It is to be noted that the shortest distance is employed as L. Further, a radius of curvature in each corner of the structure body 530 is denoted by R. In this embodiment mode, when R is set to L/5 to L/50, damage such as a crack or a chip can be prevented in the structure body 530.

It is to be noted that in this embodiment mode, the distance between facing sides at the time of assuming the structure body to be rectangle is denoted by L. However, in the case of using a structure body without parallel sides, which is difficult to be assumed as a rectangle, a distance between the middle point of a given side and a point where a perpendicular bisector of the given side intersects with another side is denoted by L. In the case where a plurality of Ls are obtained, the smallest value is used as L.

With the above-described structure, reliability of an RF tag with respect to external force can be increased. Accordingly, environmental conditions under which the RF tag can work can be further varied, and thus, versatility of an RF tag can be further achieved.

This embodiment mode can be implemented by being combined with any of the above embodiment modes as appropriate.

Embodiment Mode 8

This embodiment mode describes an example of a transistor in an element layer included in a semiconductor device of the present invention.

Figure 20A:
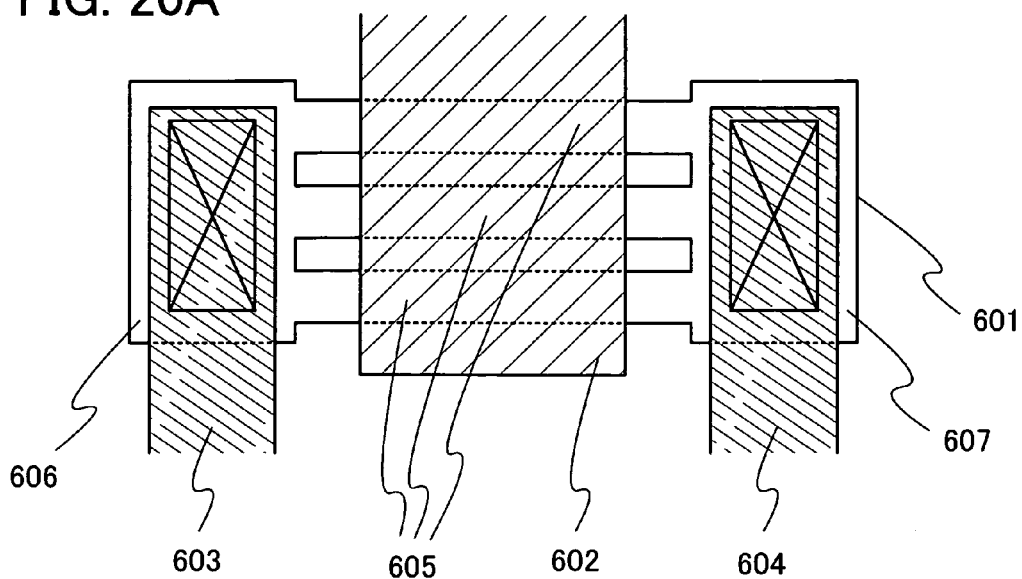
FIGS. 20A and 20B are top views of transistors included in semiconductor devices of the present invention.

FIG. 20A shows a top view of a transistor of this embodiment mode. A transistor shown in FIG. 20A includes a semiconductor film 601 used as an active layer, a gate insulating film, and an electrode 602 overlapping with the semiconductor film 601 with the gate insulating film interposed therebetween. Wirings 603 and 604 are respectively connected to impurity regions 606 and 607 which are in the semiconductor film 601 and serve as a source and a drain. In order to clarify the structure of the semiconductor film 601 and the electrode 602, the gate insulating film is not shown in FIG. 20A, and only the semiconductor film 601, the electrode 602, and the wirings 603 and 604 are shown in FIG. 20A.

A portion of the semiconductor film 601 between the impurity regions 606 and 607, which overlaps with the electrode 602 with the gate insulating film interposed therebetween, is a channel formation region 605. In the transistor shown in FIG. 20A, the semiconductor film 601 has a plurality of channel formation regions 605 which are mutually separated.

With the use of a transistor having a multi-channel structure including a plurality of channel formation regions which are mutually separated as shown in FIG. 20A, even when one of the channel formation regions is destroyed by external force, carriers are movable in other channel formation regions. Therefore, with the use of a transistor having a multi-channel structure, reliability of a semiconductor device with respect to external force can be further increased.

Figure 20B:
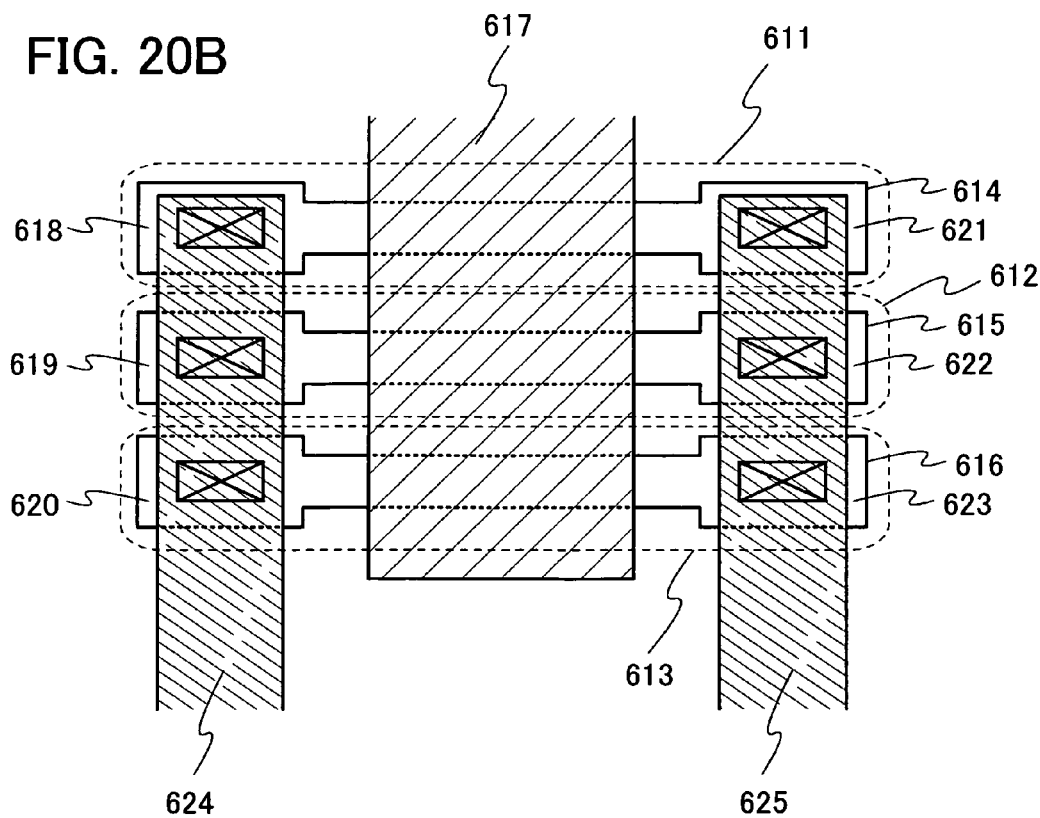

Instead of a transistor having a multi-channel structure as shown in FIG. 20A, a plurality of transistors which are connected in parallel may be used. FIG. 20B is a top view of a plurality of transistors which are connected in parallel. Transistors 611, 612, and 613 shown in FIG. 20B respectively have semiconductor films 614, 615, and 616 used as active layers. Further, each of the transistors 611 to 613 has a gate insulating film and an electrode 617 overlapping with the respective semiconductor films 614, 615, and 616 with the gate insulating film interposed therebetween. Impurity regions 618 to 620 each serving as a source in the semiconductor films 614 to 616 are connected to a wiring 624, and impurity regions 621 to 623 each serving as a drain in the semiconductor films 614 to 616 are connected to a wiring 625. In order to clarify the structure of the semiconductor films 614 to 616, the gate insulating film is not shown in FIG. 20B, and only the semiconductor films 614 to 616, the electrode 617, and the wirings 624 and 625 are shown in FIG. 20B.

The sources of the transistors 611 to 613 are connected to each other, and drains thereof are also connected to each other. Further, the transistors 611 to 613 share the electrode 617 serving as a gate. Accordingly, in a manner similar to the transistor having a multi-channel structure which is shown in FIG. 20A, even when any of the semiconductor films 614 to 616 is destroyed by external force, carriers are movable in channel formation regions included in other semiconductor films. Therefore, with the use of a plurality of transistors which are mutually connected in parallel, reliability of a semiconductor device with respect to external force can be further increased.

Figure 21A:
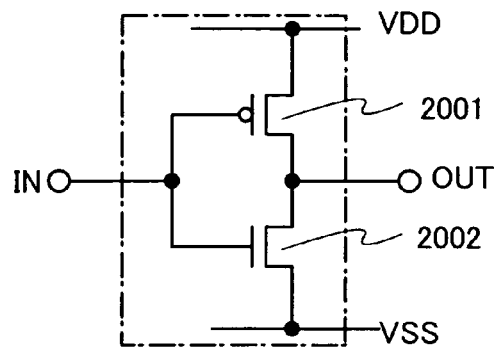
FIGS. 21A to 21C illustrate a structure of an inverter included in a semiconductor device of the present invention.

Next, a specific structure of various circuits using transistors each having a multi-channel structure is described using an inverter as an example. FIG. 21A is an example of a circuit diagram of an inverter and FIG. 21B is an example of a top view of the inverter shown in FIG. 21A.

The inverter shown in FIG. 21A includes a p-channel transistor 2001 and an n-channel transistor 2002. The transistor 2001 and the transistor 2002 are connected in series. In specific, a drain of the transistor 2001 and a drain of the transistor 2002 are connected to each other. A potential of the drain of the transistor 2001 and the drain of the transistor 2002 is applied to an output terminal OUT.

A gate of the transistor 2001 and a gate of the transistor 2002 are connected to each other. A potential of a signal input to an input terminal IN is applied to the gate of the transistor 2001 and the gate of the transistor 2002. High-level voltage VDD is applied to a source of the transistor 2001, and low-level voltage VSS is applied to a source of the transistor 2002.

Figure 21B:
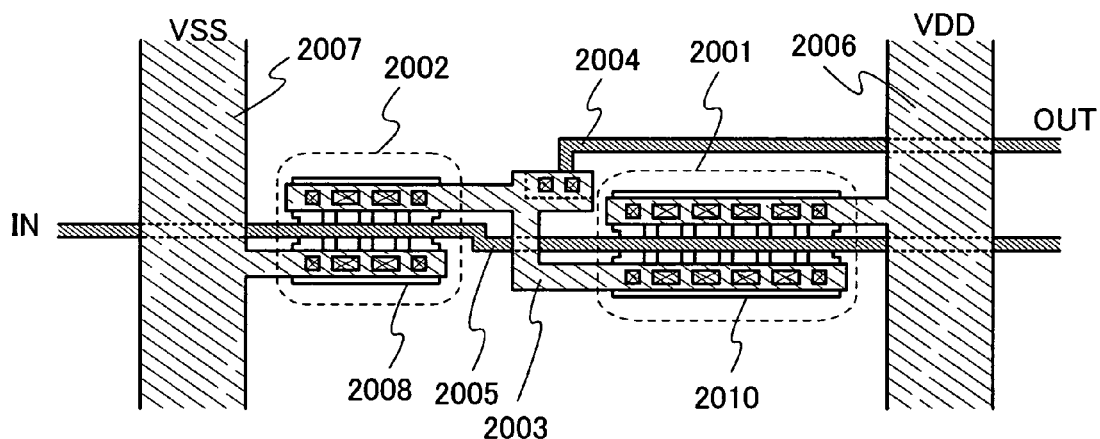

In the inverter shown in FIG. 21B, the drain of the transistor 2001 and the drain of the transistor 2002 are electrically connected to each other through a wiring 2003. The wiring 2003 is connected to a wiring 2004. Thus, a potential of the drain of the transistor 2001 and the drain of the transistor 2002 is applied to a circuit in a next stage as a potential of the output terminal OUT through the wirings 2003 and 2004.

Further, in the inverter shown in FIG. 21B, part of the wiring 2005 serves as the gate of the transistor 2001 and the gate of the transistor 2002. Thus, a potential applied to the wiring 2005 is applied to the gate of the transistor 2001 and the gate of the transistor 2002 as a potential of the input terminal IN. Voltage VDD is applied to the source of the transistor 2001 through the wiring 2006, and voltage VSS is applied to the source of the transistor 2002 through the wiring 2007.

Figure 21C:
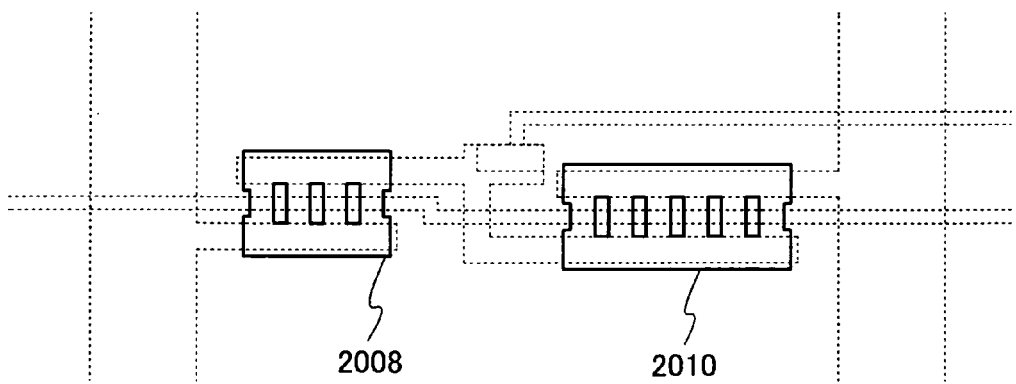

A semiconductor film 2008 included in the transistor 2002 and a semiconductor film 2010 included in the transistor 2001 each have a plurality of channel formation regions which are mutually separated. In order to clarify the shapes of the semiconductor films 2008 and 2010, FIG. 21C shows only the semiconductor films 2008 and 2010 in the inverter shown in FIG. 21B. As shown in FIG. 21C, the semiconductor films 2008 and 2010 each have a plurality of channel formation regions which are mutually separated. Accordingly, even when one of channel formation regions is destroyed by external force, carriers are movable in other channel formation regions. Therefore, with the use of the transistors 2001 and 2002 each having a multi-channel structure, reliability of a semiconductor device with respect to external force can be further increased.

Figure 22A:
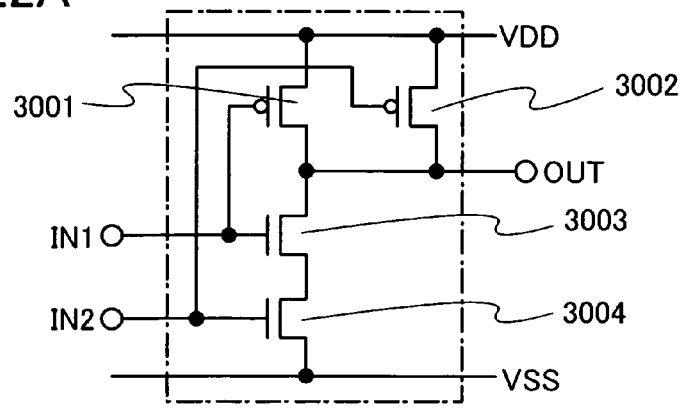
FIGS. 22A to 22C are a circuit diagram and top views of a NAND circuit included in a semiconductor device of the present invention.

Next, a specific structure of various circuits using a transistor having a multi-channel structure is described using a NAND circuit as an example. FIG. 22A is a circuit diagram of a NAND circuit and FIG. 22B is a top view of the NAND circuit shown in FIG. 22A, as an example.

The NAND circuit shown in FIG. 22A includes a p-channel transistor 3001, a p-channel transistor 3002, an n-channel transistor 3003, and an n-channel transistor 3004. The transistors 3001, 3003, and 3004 are sequentially connected in series. The transistors 3001 and 3002 are connected in parallel.

In specific, high-level voltage VDD is applied to one of a source and a drain of the transistor 3001, and the other of the source and the drain is connected to an output terminal OUT. High-level voltage VDD is applied to one of a source and a drain of the transistor 3002, and the other of the source and the drain is connected to the output terminal OUT. Low-level voltage VSS is applied to one of a source and a drain of the transistor 3004. One of a source and a drain of the transistor 3003 is connected to the output terminal OUT. The other of the source and the drain of the transistor 3003 is connected to the other of the source and the drain of the transistor 3004. A potential of an input terminal IN1 is applied to a gate of the transistor 3001 and a gate of the transistor 3003. A potential of an input terminal IN2 is applied to a gate of the transistor 3002 and a gate of the transistor 3004.

Figure 22B:
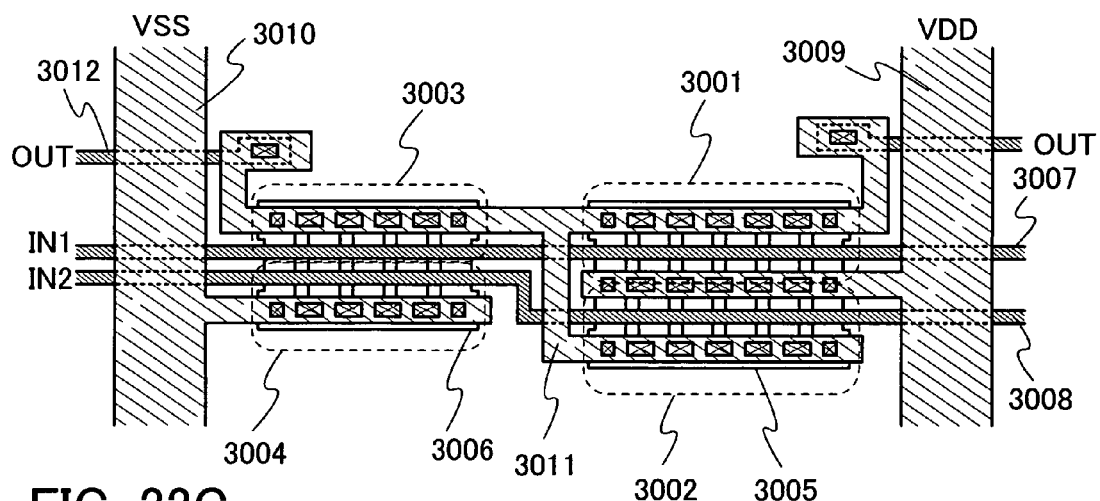

In the NAND circuit shown in FIG. 22B, the transistors 3001 and 3002 connected in series share a semiconductor film 3005, and the transistors 3003 and 3004 connected in series share a semiconductor film 3006. Part of a wiring 3007 serves as the gate of the transistor 3001 and the gate of the transistor 3003. Thus, a potential applied to the wiring 3007 is applied to the gate of the transistor 3001 and the gate of the transistor 3003 as a potential of the input terminal IN1. Part of a wiring 3008 serves as the gate of the transistor 3002 and the gate of the transistor 3004. Thus, a potential applied to the wiring 3008 is applied to the gate of the transistor 3002 and the gate of the transistor 3004 as a potential of the input terminal IN2.

High-level voltage VDD is applied to one of the source and the drain of the transistor 3001 and one of the source and the drain of the transistor 3002 through a wiring 3009. Low-level voltage VSS is applied to one of the source and the drain of the transistor 3004 through a wiring 3010. A potential of the other of the source and the drain of the transistor 3001, the other of the source and the drain of the transistor 3002, and the one of the source and the drain of the transistor 3003 is applied to a circuit in a next stage as a potential of the output terminal OUT through wirings 3011 and 3012.

Figure 22C:
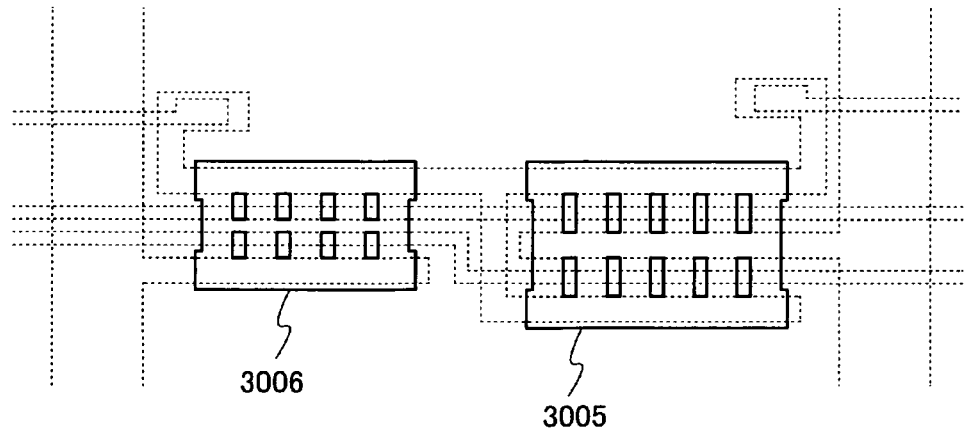

The semiconductor films 3005 and 3006 each have a plurality of channel formation regions which are mutually separated. In order to clarify the shapes of the semiconductor films 3005 and 3006, FIG. 22C shows only the semiconductor films 3005 and 3006 in the NAND circuit shown in FIG. 22B. As shown in FIG. 22C, the semiconductor films 3005 and 3006 each have a plurality of channel formation regions which are mutually separated. Accordingly, even when one of channel formation regions is destroyed by external force, carriers are movable in other channel formation regions. Therefore, with the use of the transistors 3001 to 3004 each having a multi-channel structure, reliability of a semiconductor device with respect to external force can be further increased.

This embodiment mode can be implemented by being combined with any of the above-described embodiment modes as appropriate.

Embodiment Mode 9

The proportion of operating semiconductor devices at the time of locally applying linear pressure with calender rolls was tested by the present inventors.

In the test, an RF tag was used as a semiconductor device. For an RF tag in each sample, an on-chip type was used in which an integrated circuit and an antenna are formed over the same substrate. In each sample, an element layer including an integrated circuit and an antenna was interposed between a pair of prepregs; and the integrated circuit, the antenna, and the pair of prepregs were embedded in paper.

The test was conducted on an RF tag in which an element layer was interposed between a pair of prepregs each having a fibrous body of one layer (a sample A), an RF tag in which an element layer was interposed between a pair of prepregs each having fibrous bodies of two layers (a sample B), an RF tag in which an element layer was interposed between a pair of prepregs each having a fibrous body of one layer (a sample C), and an RF tag in which an element layer was interposed between a pair of prepregs each having a fibrous body of one layer (a sample D). Each of the fibrous bodies in the samples A to C had 50 yarn bundles with a diameter of 4 μm which were made of glass fibers. Each of the fibrous bodies in the sample D had 100 yarn bundles with a diameter of 4 μm which were made of glass fibers. In each sample, the fibrous body was woven using warp yarns and weft yarns by plain weave.

In the sample A, the thickness of each prepreg of the pair of prepregs which had not been subjected to heating and pressure bonding was 15 μm. Further, the total thickness of the sample A was approximately 32.7 μm, which was formed in such a way that the pair of prepregs was subjected to heating and pressure bonding with an element layer interposed therebetween. In the sample B, each prepreg of the pair of prepregs was formed in such a way that prepregs of two layers were stacked and subjected to heating and pressure bonding, where the prepreg had a thickness of 15 μm and was the same type as in the sample A. Further, the total thickness of the sample B was approximately 63.0 μm, which was formed in such a way that the pair of prepregs was subjected to heating and pressure bonding with an element layer interposed therebetween. In the sample C, the thickness of the resin was twice as large as the sample A, and the thickness of each prepreg of the pair of prepregs which had not been subjected to heating and pressure bonding was 30 μm. Further, the total thickness of the sample C was approximately 58.0 μm, which was formed in such a way that the pair of prepregs was subjected to heating and pressure bonding with an element layer interposed therebetween. In the sample D, the thickness of the resin was twice as large as the sample A, and the thickness of each prepreg of the pair of prepregs which had not been subjected to heating and pressure bonding was 30 μm. Further, the total thickness of the sample D was approximately 57.5 μm, which is formed in such a way that the pair of prepregs was subjected to heating and pressure bonding with an element layer interposed therebetween.

Further, in each of the samples A to D, the area of an RF tag was 10.5 mm×12.0 mm. The test was also conducted on samples A' to D', in which the only difference between the samples A and A' was in the area of an RF tag; the only difference between the samples B and B' was in the area of an RF tag; the only difference between the samples C and C' was in the area of an RF tag; and the only difference between the samples D and D' was in the area of an RF tag. The area of the RF tag in each of the samples A' to D' was 9.0 mm×9.5 mm.

Further, each of the samples A to D and the samples A' to D' has a structure such that an integrated circuit, an antenna, and a pair of prepregs are embedded in paper so that the weight is approximately 150 g/cm².

In the test, linear pressure was applied to each sample, with calender rolls. For the calender rolls, a first roll which is cylindrical and made of metal and a second roll which is cylindrical and made of urethane rubber are used. The temperature of the first roll was set to 100° C. and the temperature of the second roll was set to 75° C. A sample was put between the first roll and the second roll, and the first roll and the second roll were rotated so that the speed of the rolls was 7000 mm/min. Thus, linear pressure was applied to the whole sample. Linear pressure corresponds to a value obtained by dividing the pressure applied between the first roll and the second roll by a contact width between the first roll and the second roll. The present test was conducted under two conditions where linear pressure is 100 kg/cm and linear pressure is 200 kg/cm.

Table 1 shows the number of respective samples which normally operated before linear pressure was applied by calender rolls (i.e. the number of samples which has not been subjected to treatment), the number of respective samples which normally operated after the linear pressure was applied (i.e. the number of samples which has been subjected to the treatment), and the proportion of operating samples, which are shown in respective linear pressures. Whether the sample normally operated or not was judged whether a correct identification number could be read without contact. The proportion of operating samples was calculated from the proportion of the number of samples which had been subjected to the treatment in the number of samples which had not been subjected to treatment yet.

TABLE 1

| linear pressure (kg/cm) | samples | the number of samples before treatment | the number of samples after treatment | proportions of operating (%) |
| --- | --- | --- | --- | --- |
| 100 | A | 25 | 14 | 50.6 |
| | B | 27 | 27 | 100.0 |
| | C | 17 | 16 | 94.1 |
| | D | 18 | 17 | 94.4 |
| | A' | 18 | 7 | 38.9 |
| | B' | 26 | 25 | 96.2 |
| | C' | 27 | 23 | 85.2 |
| | D' | 17 | 13 | 76.5 |
| 200 | A | 27 | 1 | 3.7 |
| | B | 26 | 26 | 100.0 |
| | C | 18 | 17 | 94.4 |
| | D | 18 | 15 | 83.3 |
| | A' | 18 | 0 | 0.0 |
| | B' | 26 | 17 | 65.4 |
| | C' | 27 | 11 | 40.7 |
| | D' | 17 | 9 | 52.9 |

The proportions of the operating samples A to D which is shown in Table 1 are compared. From the comparison, the proportion of the operating sample B was the highest in either condition of linear pressure. Further, the proportions of the operating samples A' to D' which are shown in Table 1 are compared. From the comparison, the proportion of the operating samples B' was the highest in either condition of linear pressure. Accordingly, from the result of the test described in this embodiment mode, it is found that reliability of a semiconductor device with respect to linear pressure can be increased with the use of a prepreg having a stack of fibrous bodies compared with a prepreg having a fibrous body of one layer though the thicknesses of the pregregs are almost the same.

Embodiment 1

Figure 23:
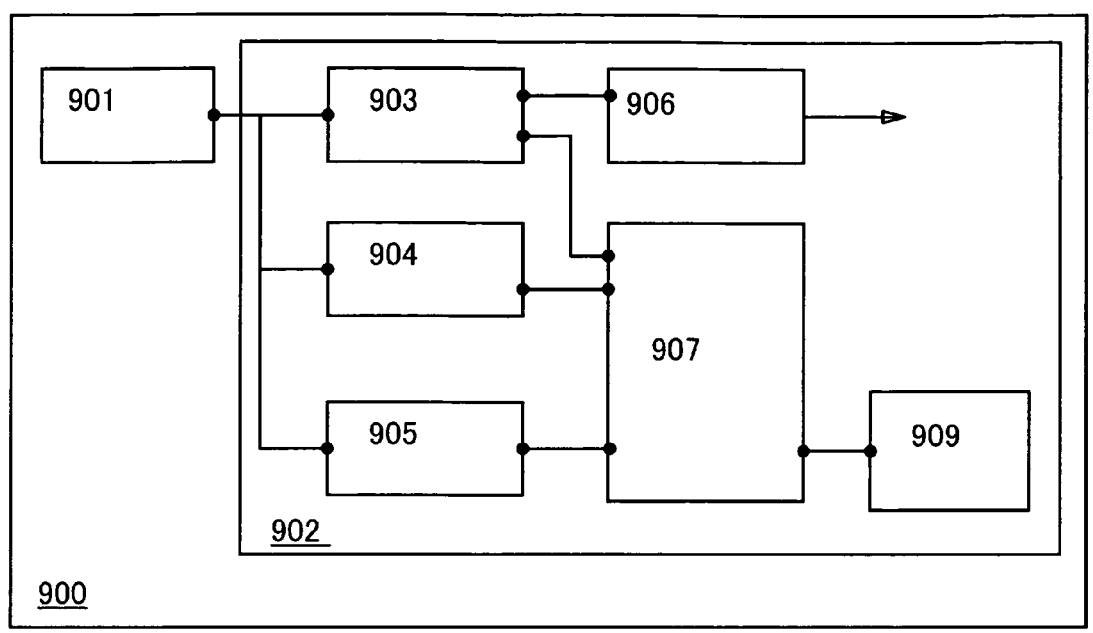
FIG. 23 illustrates a structure of an RF tag of the present invention.

This embodiment describes a structure of an RF tag which is one of semiconductor devices of the present invention. FIG. 23 is a block diagram illustrating one mode of an RF tag of the present invention. In FIG. 23, an RF tag 900 has an antenna 901 and an integrated circuit 902. The integrated circuit 902 has a power supply circuit 903, a demodulation circuit 904, a modulation circuit 905, a regulator 906, a control circuit 907, and a memory 909. The rectifier circuit of the present invention can be used in the power supply circuit 903 and the demodulation circuit 904.

When radio waves are transmitted from an interrogator, the radio waves are converted into an AC voltage in the antenna 901. In the power supply circuit 903, the AC voltage from the antenna 901 is rectified to generate a voltage for a power supply. The voltage for a power supply, which is generated in the power supply circuit 903, is fed to the control circuit 907 and the regulator 906. After stabilizing the voltage for a power supply from the power supply circuit 903 or after adjusting the level thereof, the regulator 906 supplies the voltage to circuits such as the demodulation circuit 904, the modulation circuit 905, the control circuit 907, or the memory 909 in the integrated circuit 902.

The demodulation circuit 904 demodulates the AC signal received by the antenna 901 to output the signal to the control circuit 907 of a next stage. The control circuit 907 performs arithmetic processing in accordance with the signal inputted from the demodulation circuit 904 and generates a new signal. When the arithmetic processing is performed, the memory 909 can be used as a primary cache memory or a secondary cache memory. Further, the control circuit 907 analyses the signal inputted from the demodulation circuit 904, and data in the memory 909 is outputted or the content of an instruction in the memory 909 is stored in accordance with the content of an instruction transmitted from the interrogator. The signal outputted from the control circuit 907 is encoded and transmitted to the modulation circuit 905. The modulation circuit 905 modulates the radio waves received by the antenna 901 in accordance with the signal. The radio waves modulated in the antenna 901 is received by the interrogator. Then, data outputted from the RF tag 900 can be obtained.

Thus, communication between the RF tag 900 and the interrogator can be performed by modulating a radio waves used as a carrier (carrier wave). As the carrier, there are radio waves with frequencies of 125 kHz, 13.56 MHz, 950 MHz, and the like, which vary depending on the standard. A modulation method includes various methods such as amplitude modulation, frequency modulation, and phase modulation, depending on the standard; however, any modulation method may be employed as long as it is based on the standard.

A signal transmission method can be categorized into an electromagnetic coupling method, an electromagnetic induction method, a microwave method, and the like depending on the wavelength of a carrier. In the case of an electromagnetic coupling method or an electromagnetic induction method, there is a possibility that an RF tag is subjected to an intense radio wave and thus an excessively high AC voltage occurs in an antenna. Using the rectifier circuit of the present invention makes it possible to prevent deterioration or destruction of a semiconductor element in an integrated circuit, which is particularly effective for the case of an electromagnetic coupling method or an electromagnetic induction method.

The memory 909 may be either a nonvolatile memory or a volatile memory. As the memory 909, a DRAM (dynamic random access memory), an SRAM (static random access memory), an FeRAM, a mask ROM, an EPROM (electrically programmable read only memory), an EEPROM (electrically erasable and programmable read only memory), a flash memory, an organic memory, or the like can be used, for example.

In this embodiment, a structure of the RF tag 900 having the antenna 901 is described; however, the RF tag of the present invention does not necessarily include an antenna. In addition, the RF tag illustrated in FIG. 23 may be provided with an oscillation circuit or a secondary battery.

In FIG. 23, a structure of the RF tag including only one antenna is described; however, the present invention is not limited to this structure. The RF tag may have two antennas, that is, an antenna for receiving power and an antenna for receiving a signal. If the RF tag has one antenna, in the case where both supply of power and transmission of a signal are performed with radio waves of 950 MHz for example, a large amount of power might be transmitted to a distance to impede reception of other wireless devices. Therefore, it is desirable that power be supplied over a short distance using radio waves with reduced frequency; however, a communication distance is inevitably short in this case. On the other hand, if the RF tag includes two antennas, frequency of radio waves for supplying power and frequency of radio waves for transmitting a signal can be separately used. For example, in the case of transmitting power, electromagnetic induction using radio waves at a frequency of 13.56 MHz can be used, and in the case of transmitting a signal, a radio frequency method using radio waves at a frequency of 950 MHz can be used. By thus separately using antennas depending on functions, power can be supplied for communication only over a short distance and a signal can be transmitted even over a long distance.

Since an RF tag which is one of semiconductor devices of the present invention has high reliability with respect to external force, environmental conditions under which the RF tag can be used can be varied; thus, greater versatility of an RF tag can be achieved.

This embodiment can be implemented by being combined with any of the above-described embodiment modes as appropriate.

Embodiment 2

This embodiment describes a structure of a CPU (central processing unit) which is one of semiconductor devices of the present invention will be described.

Figure 24:
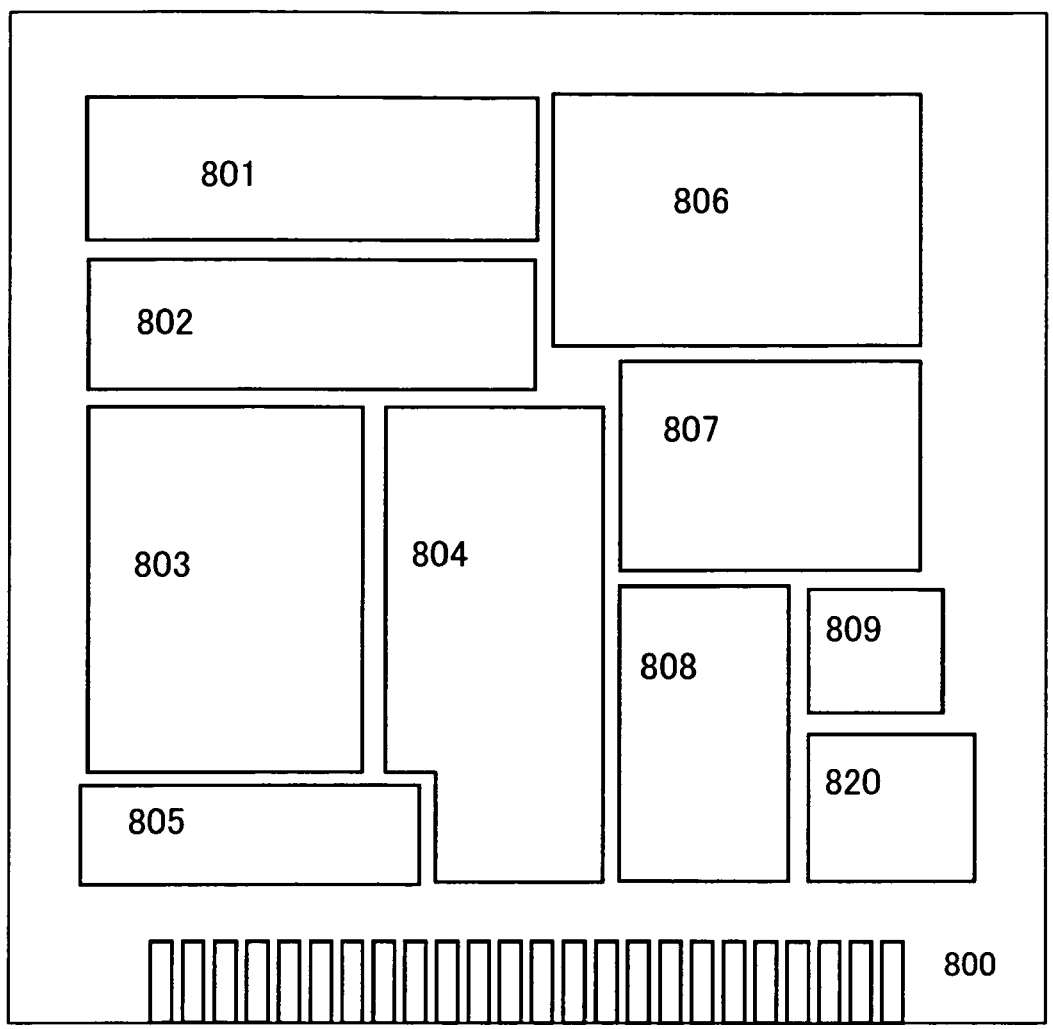
FIG. 24 illustrates a structure of a CPU of the present invention.

FIG. 24 is a block diagram illustrating a structure of the CPU of this embodiment. A CPU shown in FIG. 24 mainly includes an arithmetic logic unit (ALU) 801, an ALU controller 802, an instruction decoder 803, an interrupt controller 804, a timing controller 805, a register 806, a register controller 807, a bus interface (Bus I/F) 808, a memory 809 and a memory interface 820, over a substrate 800. The memory 809 and the memory interface 820 may be provided over another chip. Naturally, the CPU shown in FIG. 24 is only an example in which the configuration is simplified, and an actual CPU may have various configurations depending on the uses.

An instruction inputted to the CPU through the bus interface 808 is decoded in the instruction decoder 803, and then inputted to the ALU controller 802, the interrupt controller 804, the register controller 807 and the timing controller 805. The ALU controller 802, the interrupt controller 804, the register controller 807 and the timing controller 805 conduct various controls based on the decoded instruction. Specifically, the ALU controller 802 generates signals for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates signals for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the above-mentioned circuits.

A CPU which is one of semiconductor devices of the present invention has high reliability with respect to external force. Accordingly, mechanical strength of an electronic device using a CPU of the present invention, especially a portable electronic device which is assumed to be carried by a user, with respect to vibration and shock can be further increased.

This embodiment can be implemented by being combined with any of the above-described embodiment modes and the above-described embodiment as appropriate.

Embodiment 3

Since an RF tag which is one of semiconductor devices of the present invention has flexibility, the RF tag is preferably attached to an object having flexibility or an object having a curved surface. Further, the RF tag of the present invention has not only high shock and vibration resistance but also high reliability with respect to local pressing force; therefore, the range of uses of the RF tag is wide.

In addition, when an integrated circuit in the RF tag of the present invention includes a memory such as a ROM where data cannot be rewritten, it is possible to prevent counterfeiting of an object to which the RF tag is attached. Further, when the RF tag of the present invention is used for foods whose commercial value depends crucially on a production area, a producer, and the like, forgery of production area, a producer, and the like can be prevented.

Specifically, the RF tag of the present invention can be attached to a tag having data on the object, such as a shipping tag, a price tag, and a name tag. Instead, the RF tag of the invention itself can be used as a tag. Alternatively, the RF tag of the present invention can be attached to a certificate corresponding to a document stating that a fact is true, such as a family register, a resident card, a passport, a driving license, an identification card, a membership card, a survey report, a credit card, a cash card, a prepaid card, a patient's registration card, and a commuter pass. Further alternatively, the RF tag of the present invention can be attached to securities corresponding to securities stating private property rights, such as a bill of exchange, a check, a receipt note, a bill of lading, a warehouse receipt, a stock, a bond, a gift certificate, and a mortgage certificate.

For example, the RF tag of the present invention may be attached to, for example, a label of the article to perform distribution management of the article using the RF tag.

Figure 25A:
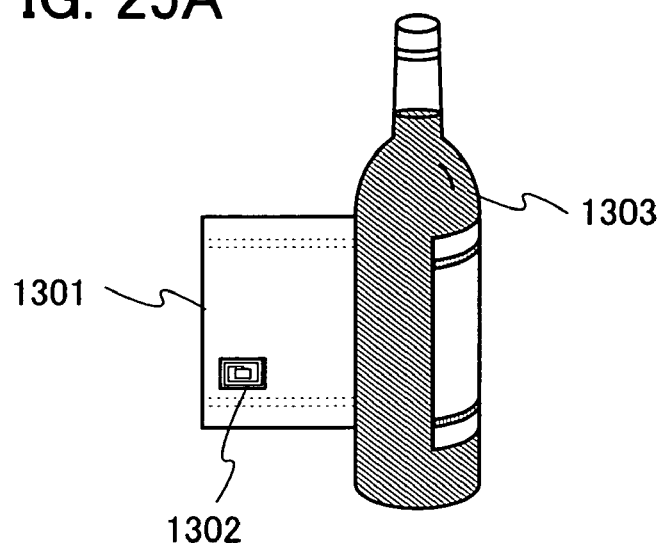
FIGS. 25A to 25C illustrate usage patterns of an RF tag of the present invention.

As shown in FIG. 25A, an RF tag 1302 of the present invention is attached to a support such as a label 1301 of an article, of which the rear surface has adhesiveness. The label 1301 to which the RF tag 1302 is attached is put on an article 1303. Identification data on the article 1303 can be read wirelessly from the RF tag 1302 attached to the label 1301. Accordingly, the RF tag 1302 facilitates article management in the distribution process. The RF tag of the present invention has the advantage that it is not easily destroyed by stress even when attached to the label 1301 having flexibility. Therefore, the label 1301 using the RF tag of the present invention is preferably attached to the object having a curved surface. Further, since the RF tag 1302 of the present invention has high reliability with respect to pressing force, the RF tag 1302 is not easily destroyed in the distribution process.

For example, if a rewritable nonvolatile memory is used as a memory of an integrated circuit in the RF tag 1302, the distribution process of the article 1303 can be recorded. In addition, when the production process of the product is recorded, a wholesaler, a retailer and a consumer can easily find out a production area, a producer, a date of manufacture, a processing method and the like.

Figure 25B:
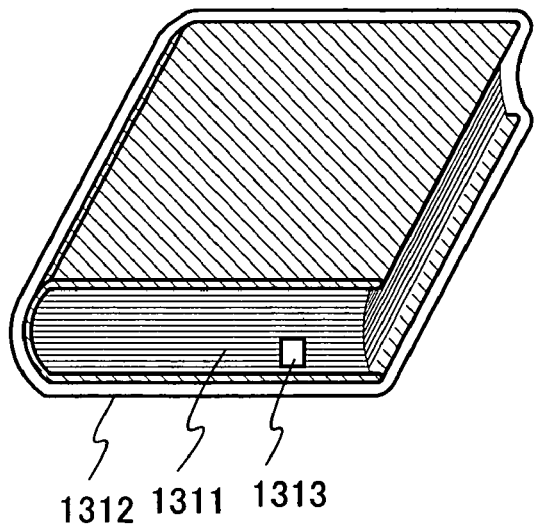

In the case of items having value on their contained information, for example, books, DVDs, and CDs, there is a problem in that disclosure of total information contained in the items lowers their value as items; on the other hand, veiling information completely makes it difficult to appreciate their value as items. Wrapping the above items with a wrapping material to which the RF tag of the present invention is affixed, and then storing a part of information contained in the items in the RF tag enable customers to appreciate value of the items without lowering value of the items. FIG. 25B shows a book 1311 wrapped with a wrapping material 1312 to which an RF tag 1313 of the present invention is affixed.

Then, for example, a portable information terminal like a mobile phone to which a function as an interrogator is added has customers grasp part of contents of the book 1311.

According to the above structure, even if total information contained in the items is not disclosed, customers can know the contents of the items.

Figure 25C:
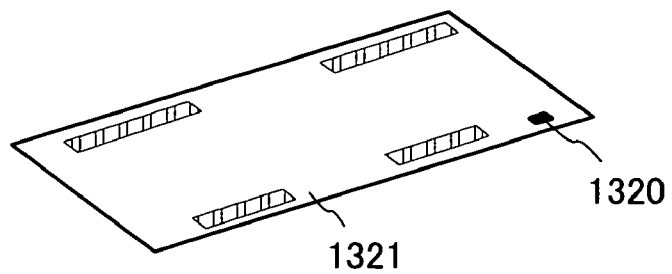

FIG. 25C shows an example of a bearer bond 1321 incorporating an RF tag 1320 of the present invention. The bearer bond 1321 includes a stamp, a ticket, an admission ticket, a gift certificate, a book coupon, a stationery coupon, a beer coupon, a rice coupon, various gift coupons, various service coupons, and the like, but of course, the bearer bond 1321 is not limited thereto. The RF tag 1320 may be put inside the bearer bond 1321, or exposed outside the bearer bond 1321. The RF tag of the present invention has the advantage that it is not easily destroyed by stress even when attached to the bearer bond 1321 having flexibility.

This embodiment can be implemented by being combined with any of the above-described embodiment modes and the above-described embodiments as appropriate.

Embodiment 4

Figure 26A:
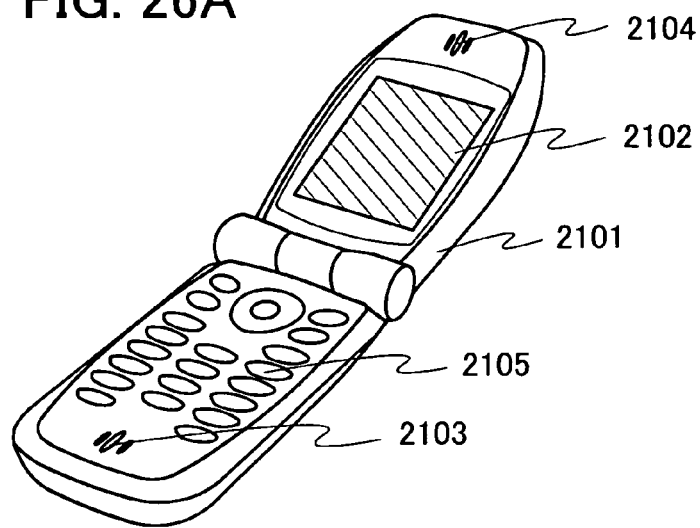
FIGS. 26A to 26C illustrate electronic devices each using a semiconductor device of the present invention.
Figure 26B:
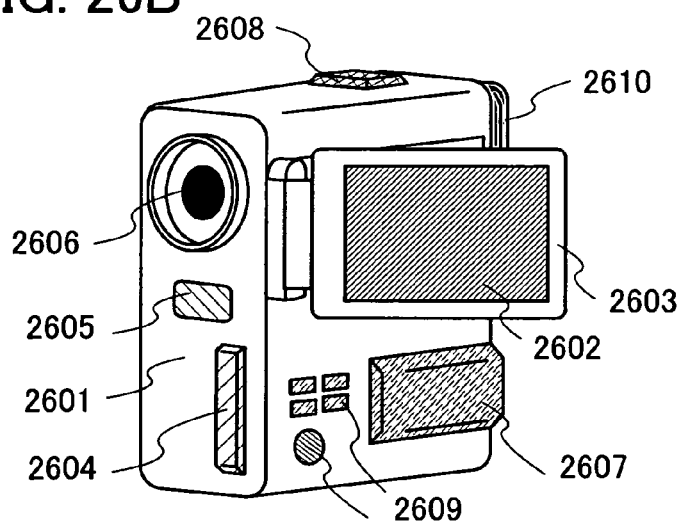
Figure 26C:
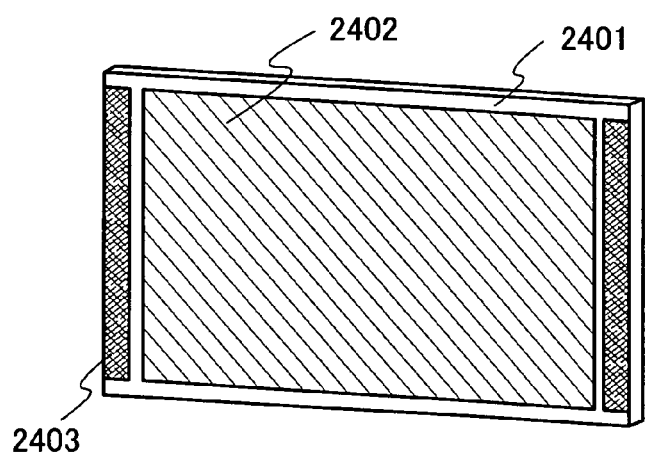

As an electronic device which can use the semiconductor device of the present invention, a cellular phone, a portable game machine, an e-book reader, a video camera, a digital still camera, a goggle display (a head mounted display), a navigation system, an audio reproducing device (e.g., a car audio or an audio component set), a laptop computer, an image reproducing device provided with a recording medium (typically, a device which reproduces a recording medium such as a digital versatile disc (DVD) and has a display that can display the reproduced image), and the like can be given. FIGS. 26A to 26C show specific examples of these electronic devices.

FIG. 26A shows a cellular phone, which includes a main body 2101, a display portion 2102, an audio input portion 2103, an audio output portion 2104, and operation keys 2105. By using the semiconductor device of the present invention for the display portion 2102 or for an integrated circuit in another portion, a cellular phone which has high reliability with respect to external force can be obtained.

FIG. 26B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the semiconductor device of the present invention for the display portion 2602 or for an integrated circuit in another portion, a video camera which has high reliability with respect to external force can be obtained.

FIG. 26C shows an image display device, which includes a housing 2401, a display portion 2402, a speaker portion 2403, and the like. By using the semiconductor device of the present invention for the display portion 2402 or for an integrated circuit in another portion, an image display device which has high reliability with respect to external force can be obtained. It is to be noted that the image display device corresponds to all image display devices which are used to display images, such as those for personal computers, television broadcast reception, and advertisement display.

As described above, the application range of the present invention is extremely wide and the present invention can be applied to electronic devices in all fields.

This embodiment can be implemented by being combined with any of the above-described embodiment modes and the above-described embodiments as appropriate.

This application is based on Japanese Patent Application serial no. 2007-151168 filed with Japan Patent Office on Jun. 7, 2007, the entire contents of which are hereby incorporated by reference.

What is claimed is:

1. A semiconductor device comprising:
an element layer including a semiconductor element; and
a pair of structure bodies, each of the pair of structure bodies including a stack of a plurality of fibrous bodies which are impregnated with an organic resin,
wherein the element layer is fixed between the pair of structure bodies, and
wherein each of the plurality of fibrous bodies is woven fabric.

2. The semiconductor device according to claim 1, wherein the semiconductor element includes a transistor, the transistor including a plurality of channel formation regions which are mutually separated.

3. The semiconductor device according to claim 1, wherein the semiconductor element includes a plurality of transistors, gates of the plurality of transistors being connected to each other, sources thereof being connected to each other, and drains thereof being connected to each other.

4. The semiconductor device according to claim 1, wherein the fibrous body includes a material selected from a group consisting of a polyvinyl alcohol fiber, a polyester fiber, a polyamide fiber, a polyethylene fiber, an aramid fiber, a polyparaphenylene benzobisoxazole fiber, a glass fiber, and a carbon fiber.

5. The semiconductor device according to claim 1, wherein the organic resin includes a thermosetting resin or a thermoplastic resin.

6. The semiconductor device according to claim 5, wherein the thermosetting resin is an epoxy resin, an unsaturated polyester resin, a polyimide resin, a bismaleimide-triazine resin, or a cyanate resin.

7. The semiconductor device according to claim 5, wherein the thermoplastic resin is a polyphenylene oxide resin, a polyetherimide resin, or a fluorine resin.

8. The semiconductor device according to claim 1, wherein the plurality of fibrous bodies include three or more layers.

9. The semiconductor device according to claim 1, wherein the semiconductor element includes an island-shaped semiconductor film.

10. A semiconductor device comprising:
an element layer including a semiconductor element; and
a pair of structure bodies, each of the pair of structure bodies including a stack of a plurality of fibrous bodies which are impregnated with an organic resin,
wherein a ratio of a thickness of one of the pair of structure bodies to a thickness of the other of the pair of structure bodies is greater than or equal to 0.8 and less than or equal to 1.2,
wherein the element layer is fixed between the pair of structure bodies, and
wherein each of the plurality of fibrous bodies is woven fabric.

11. The semiconductor device according to claim 10, wherein the semiconductor element includes a transistor, the transistor including a plurality of channel formation regions which are mutually separated.

12. The semiconductor device according to claim 10, wherein the semiconductor element includes a plurality of transistors, gates of the plurality of transistors being connected to each other, sources thereof being connected to each other, and drains thereof being connected to each other.

13. The semiconductor device according to claim 10, wherein the fibrous body includes a material selected from a group consisting of a polyvinyl alcohol fiber, a polyester fiber, a polyamide fiber, a polyethylene fiber, an aramid fiber, a polyparaphenylene benzobisoxazole fiber, a glass fiber, and a carbon fiber.

14. The semiconductor device according to claim 10, wherein the organic resin includes a thermosetting resin or a thermoplastic resin.

15. The semiconductor device according to claim 14, wherein the thermosetting resin is an epoxy resin, an unsaturated polyester resin, a polyimide resin, a bismaleimide-triazine resin, or a cyanate resin.

16. The semiconductor device according to claim 14, wherein the thermoplastic resin is a polyphenylene oxide resin, a polyetherimide resin, or a fluorine resin.

17. The semiconductor device according to claim 10, wherein the plurality of fibrous bodies include three or more layers.

18. The semiconductor device according to claim 10, wherein the semiconductor element includes an island-shaped semiconductor film.

19. A semiconductor device comprising:
an element layer including a semiconductor element; and
a pair of structure bodies, each of the pair of structure bodies including a stack of a plurality of fibrous bodies which are impregnated with an organic resin,
wherein each of the plurality of fibrous bodies uses warp yarns and weft yarns each formed by bundling a plurality of single yarns of an organic compound or an inorganic compound, and
wherein each of the plurality of fibrous bodies is woven fabric.

20. The semiconductor device according to claim 19, wherein the fibrous body includes a material selected from a group consisting of a polyvinyl alcohol fiber, a polyester fiber, a polyamide fiber, a polyethylene fiber, an aramid fiber, a polyparaphenylene benzobisoxazole fiber, a glass fiber, and a carbon fiber.

21. The semiconductor device according to claim 19, wherein the organic resin includes a thermosetting resin or a thermoplastic resin.

22. The semiconductor device according to claim 21, wherein the thermosetting resin is an epoxy resin, an unsaturated polyester resin, a polyimide resin, a bismaleimide-triazine resin, or a cyanate resin.

23. The semiconductor device according to claim 21, wherein the thermoplastic resin is a polyphenylene oxide resin, a polyetherimide resin, or a fluorine resin.

24. The semiconductor device according to claim 19, wherein the plurality of fibrous bodies include three or more layers.

25. The semiconductor device according to claim 19, wherein the semiconductor element includes an island-shaped semiconductor film.

26. A semiconductor device comprising:
an element layer including a semiconductor element; and
a pair of structure bodies, each of the pair of structure bodies including a stack Of a plurality of fibrous bodies which are impregnated with an organic resin,
wherein each of the plurality of fibrous bodies uses warp yarns and weft yarns each formed by bundling a plurality of single yarns of an organic compound or an inorganic compound,
wherein at least two fibrous bodies of the plurality of fibrous bodies have different directions of the warp yarns and the weft yarns, wherein the element layer is fixed between the pair of structure bodies, and wherein each of the plurality of fibrous bodies is woven fabric.

27. The semiconductor device according to claim 26, wherein the fibrous body includes a material selected from a group consisting of a polyvinyl alcohol fiber, a polyester fiber, a polyamide fiber, a polyethylene fiber, an aramid fiber, a polyparaphenylene benzobisoxazole fiber, a glass fiber, and a carbon fiber.

28. The semiconductor device according to claim 26, wherein the organic resin includes a thermosetting resin or a thermoplastic resin.

29. The semiconductor device according to claim 28, wherein the thermosetting resin is an epoxy resin, an unsaturated polyester resin, a polyimide resin, a bismaleimide-triazine resin, or a cyanate resin.

30. The semiconductor device according to claim 28, wherein the thermoplastic resin is a polyphenylene oxide resin, a polyetherimide resin, or a fluorine resin.

31. The semiconductor device according to claim 26, wherein the plurality of fibrous bodies include three or more layers.

32. The semiconductor device according to claim 26, wherein the semiconductor element includes an island-shaped semiconductor film.

* * * * *

UNITED STATES PATENT AND TRADEMARK OFFICE
CERTIFICATE OF CORRECTION

| | | |
|---|---|---|
| PATENT NO. | : 7,906,847 B2 | Page 1 of 1 |
| APPLICATION NO. | : 12/155055 | |
| DATED | : March 15, 2011 | |
| INVENTOR(S) | : Hisashi Ohtani et al. | |

It is certified that error appears in the above-identified patent and that said Letters Patent is hereby corrected as shown below:

At column 12, line 25, "sec" should be -- Vsec --;

At column 16, line 13, "GaALAs" should be -- GaAlAs --;

At column 21, line 49, "a." should be -- a --;

At column 24, line 4, "CiF3" should be -- ClF3 --;

At column 24, line 63, "GaALAs" should be -- GaAlAs --;

At column 40, line 59, "Of" should be -- of --.

Signed and Sealed this
Twenty-eighth Day of June, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,906,847 B2 | |
| APPLICATION NO. | : 12/155055 | |
| DATED | : March 15, 2011 | |
| INVENTOR(S) | : Hisashi Ohtani et al. | |

It is certified that error appears in the above-identified patent and that said Letters Patent is hereby corrected as shown below:

At column 24, line 4, "ClF3" should be --$ClF_3$--.

Signed and Sealed this
Thirteenth Day of September, 2011

David J. Kappos
*Director of the United States Patent and Trademark Office*